(12) United States Patent
Ebata et al.

(10) Patent No.: US 8,610,613 B2
(45) Date of Patent: Dec. 17, 2013

(54) SEMICONDUCTOR INTEGRATED CIRCUIT DEVICE

(75) Inventors: Tomohiko Ebata, Kanagawa (JP); Takuji Aso, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 62 days.

(21) Appl. No.: 13/397,733

(22) Filed: Feb. 16, 2012

(65) Prior Publication Data

US 2012/0212362 A1 Aug. 23, 2012

(30) Foreign Application Priority Data

Feb. 18, 2011 (JP) ................. 2011-033845

(51) Int. Cl.
*H03M 1/12* (2006.01)

(52) U.S. Cl.
USPC ................................. 341/155; 341/141

(58) Field of Classification Search
USPC ........................ 341/155, 141, 136
See application file for complete search history.

(56) References Cited

U.S. PATENT DOCUMENTS

| 4,417,234 | A | * | 11/1983 | McKenna | 341/141 |
| 4,599,640 | A | * | 7/1986 | Dischert | 348/265 |
| 4,973,976 | A | * | 11/1990 | Lee et al. | 341/141 |
| 5,248,971 | A | * | 9/1993 | Mandl | 341/141 |

FOREIGN PATENT DOCUMENTS

JP  62-86724 A  4/1987

* cited by examiner

*Primary Examiner* — Brian Young
(74) *Attorney, Agent, or Firm* — Mattingly & Malur, PC

(57) ABSTRACT

The semiconductor integrated circuit device includes a T-type switch circuit TS[k] that is between an input port A[k] and an input terminal Ain of an analog/digital conversion circuit and that includes first, second, and third PMOS transistors MP1, MP2, and MPc, and first, second, and third NMOS transistors MN1, MN2, and MNc; and a fourth PMOS transistor MPu for pre-charging the input terminal Ain to a power supply voltage VCCA. In detecting the presence or absence of a disconnection from the input port A[k] to a signal input terminal Vint[k], first, the input terminal Ain is pre-charged to the power supply voltage VCCA via the fourth PMOS transistor MPu and also the second NMOS transistor MN2 and the second PMOS transistor MP2 are turned on, and the first NMOS transistor MN1, the first PMOS transistor MP1, the third PMOS transistor MPc, and third the NMOS transistor MNc are turned off.

15 Claims, 31 Drawing Sheets

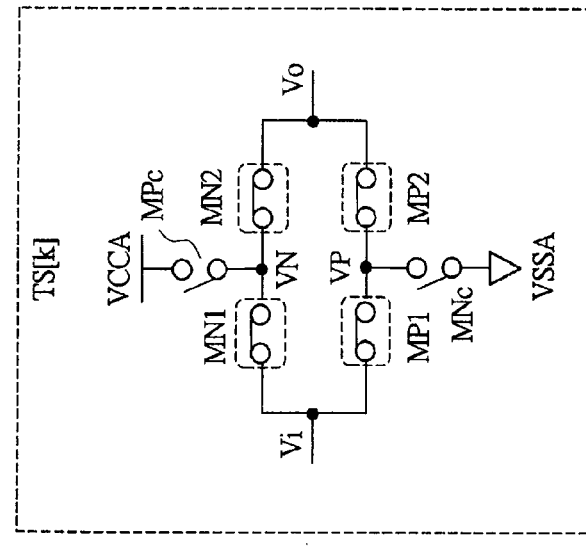
FIG. 4A — OFF MODE
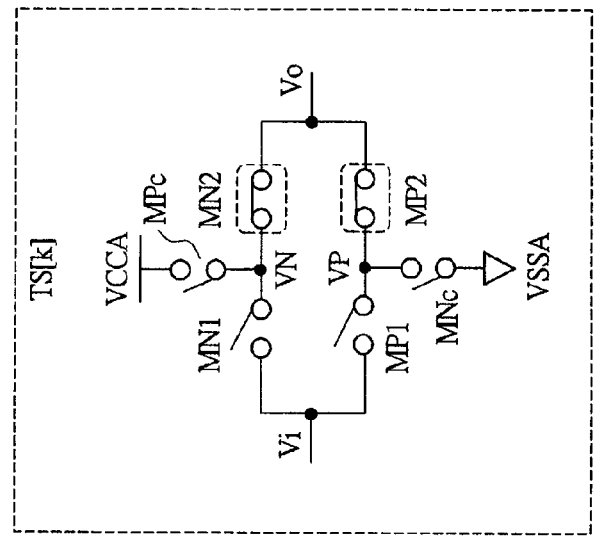
FIG. 4B — DISCONNECTION DETECTION ASSIST MODE
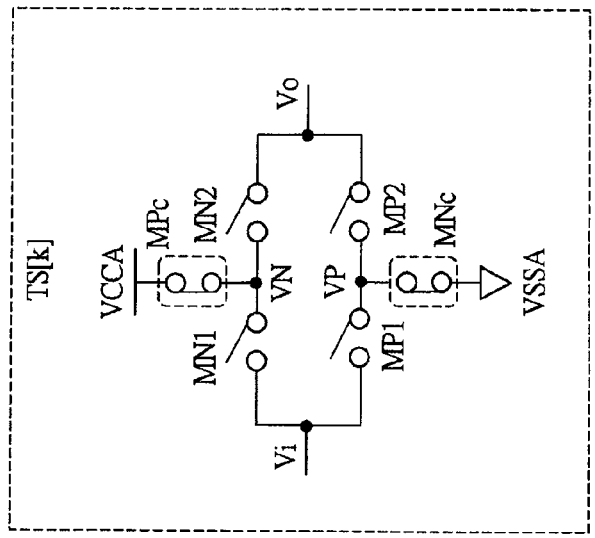
FIG. 4C — ON MODE

ON MODE

SELF PULL-UP MODE

OFF MODE

SELF DISCONNECTION DETECTION ASSIST MODE

SEMICONDUCTOR INTEGRATED CIRCUIT DEVICE

CROSS-REFERENCE TO RELATED APPLICATION

The disclosure of Japanese Patent Application No. 2011-33845 filed on Feb. 18, 2011 including the specification, drawings and abstract is incorporated herein by reference in its entirety.

BACKGROUND

The present invention relates to semiconductor integrated circuit devices, and in particular relates to the technique effectively applied to a semiconductor integrated circuit device with an analog/digital conversion circuit block having a disconnection detection function.

Japanese Patent Laid-Open No. 1987-86724 (Patent Document 1) describes a configuration, in which in a signal combining circuit for combining an actual line and an auxiliary line at one terminal, a T-type switch is arranged in each of the actual line and the auxiliary line. This T-type switch includes a first switch and a second switch connected in series over the line, a third switch connected between the common connection node of the first and second switches and a ground power supply voltage, and additionally a resistor connected in parallel to the first switch. In switching the actual line and the auxiliary line, each switch is appropriately controlled.

SUMMARY

An analog/digital conversion circuit block mounted on a semiconductor integrated circuit device (LSI), such as a microcontroller (MCU), usually includes a plurality of switches for coupling either of channels to a common analog/digital conversion circuit (ADC). FIGS. 29A to 29C are circuit diagrams each of which shows a different switch configuration in a semiconductor integrated circuit device which has been examined as a prerequisite of the present invention. FIG. 29A shows a CMOS switch circuit CS. In this circuit, the source/drain paths of a PMOS transistor MP1 and an NMOS transistor MN1 are connected in parallel between an input node IN and an output node OUT. A clock signal CLK and an inverted clock signal (/CLK) controls MN1 and MP1.

FIG. 29B shows a T-type switch circuit TS' including three PMOS transistors MP1, MP2, and MPc and three NMOS transistors MN1 and MN2, and MNc. The source/drain paths of MN1 and MN2 are connected in series between the input node IN and the output node OUT. The source/drain paths of MP1 and MP2 are connected in series between IN and OUT. MPc pulls up the voltage VN of a common connection node of MN1 and MN2 to an analog power supply voltage VCCA. MNc pulls down the voltage VP of a common connection node of MP and MP2 to an analog ground potential VSSA. The clock signal CLK controls MN1, MN2, and MPc. The inverted clock signal (/CLK) controls MP1, MP2, and MNc.

When TS' is in an on state, MN1, MN2, MP1, and MP2 are turned on and MPc and MNc are turned off. When TS' is in an off state, MN1, MN2, MP1, and MP2 are turned off and MPc and MNc are turned on. Then, VN is pulled up to VCCA and VP is pulled down to VSSA. This configuration can achieve a high isolation between IN and OUT when TS' is in an off state. If a high current flows from the IN side, most of the current flows via MPc or MNc, and MN2 and MP2 remain to be in an off state. Also, a leak to the OUT side (serving as an input terminal of ADC) is unlikely to occur.

FIG. 29C shows a T-type switch circuit ETS' with an equalizer. In this circuit, an equalizing switch is added to the configuration in FIG. 29B. The equalizing switch includes an NMOS transistor MN3 and a PMOS transistor MP3 whose source/drain paths are connected in parallel between the common connection node of MN1 and MN2 and the common connection node of MP1 and MP2. CLK drives MN3. (/CLK) drives MP3. In TS' in FIG. 29B, when TS' transitions from an off state to an on state along with the sampling by ADC, VN and VP differ in electric potential in the initial transition stage and moreover a current for setting VN and VP to the same electric potential may flow even just before the sampling ends. This current causes a voltage drop via a signal source resistance connected to the input section of a channel, causing a conversion error of ADC. The configuration in FIG. 29C can set VN and VP to the same electric potential when ETS' is on. Also, the conversion error of ADC is unlikely to occur.

Recently, such an analog/digital conversion circuit block is requested to have a disconnection detection function for detecting the presence or absence of a disconnection in an external wiring of each channel. FIG. 30 is a circuit diagram showing a configuration of the major portion around an analog/digital conversion circuit block in a semiconductor integrated circuit device, which has been examined as a prerequisite of the present invention. In FIG. 30, A[0] and A[1] are input ports for connecting the semiconductor integrated circuit device (LSI), such as a MCU, to an external circuit. This circuit has two channels of input ports.

As shown in the LSI in FIG. 29B, A[0] is connected to an input terminal Ain of the analog/digital conversion circuit ADC via a T-type switch circuit TS'[0] and A[1] is connected to the input terminal Ain via a T-type switch circuit TS'[1]. A pull-up PMOS transistor MPu driven by a clock signal CLKa0 is between Ain and VCCA. A pull-down NMOS transistor MNd driven by a clock signal CLKb0 is between Ain and VSSA. Furthermore, outside LSI, A[0] is connected to a signal input terminal Vint[0] for a channel[0] via an external resistor Ra[0] for input, and is also connected to VCCA via a pull-up external resistor Rb[0]. Similarly, A[1] is connected to a signal input terminal Vint [1] for a channel[1] via an external resistor Ra[1] for input, and is also connected to VCCA via a pull-up external resistor Rb[1].

When an analog signal (Vint[0]) of the channel[0] is converted into a digital signal, TS'[0] is turned on and TS'[1] is turned off. When an analog signal (Vint[1]) of the channel[1] is converted into a digital signal, TS'[1] is turned on and TS'[0] is turned off. It is preferable to use a T-type switch circuit with high isolation characteristics (or a T-type switch circuit with an equalizer) so that no sampling by ADC for a first channel (channel[0]) affect the analog signal of a second channel (channel[1]).

The above-mentioned disconnection detection function is a function to detect the presence or absence of a disconnection between A[0] and Vint[0] or between A[1] and Vint[1]. FIG. 30 shows that a disconnection is between A[0] and Vint[0] and no disconnection is between A[1] and Vint[1]. First, before the disconnection detection, the voltage Vb of Ain is assumed to be pre-charged to VCCA via MPu, and the voltages of Vint[0] and Vint[1] lower than VCCA are supposed to be input. Subsequently, if only TS'[0] is turned on, Vb becomes VCCA via Rb[0] because the external wiring between Vint[0] and A[0] is disconnected.

Next, Vb is assumed to be pre-charged to VCCA and subsequently only TS'[1] is assumed to be turned on. Because the external wiring is connected, the impedance (the resistance of Ra[1]) between A[1] and Vint [1] is about 0 to 1 KΩ and the impedance (the resistance of Rb[1]) between A[1] and Rb[1]

is about 1 MΩ. Because Rb[1] is higher than Ra[1], the electrical potential of Vb becomes about Vint[1]. Accordingly, the presence or absence of a disconnection can be determined by analog/digital conversion (A/D conversion) of the resulting Vb by ADC. If VCCA is output in a digital code, a disconnection is determined. If a digital code of Vint[0] or Vint[1] is output, the absence of a disconnection is determined.

However, the present inventors have found that a reliable disconnection detection may not be performed if the disconnection detection is performed by using the configuration and operation as described in FIG. 30. FIG. 31 is a waveform chart showing an operation during the disconnection detection by using the configuration in FIG. 30. As shown in FIG. 31, before the disconnection detection for the channel[0], the electric potential of Vb is pre-charged to VCCA by MPu. At this time, due to an off state of TS'[0], VN is set to VCCA, VP is set to be VSSA, and VP and Vb differ in the electric potential. When TS'[0] transitions to an on state along with the start of disconnection detection, a current IT flows to charge VP. The current IT causes a voltage drop in the resistor Rb[0], causing an A/D conversion error in VCCA by (ITxRb[0]). As a result, an error may in the disconnection detection result.

If the sampling period by ADC can be lengthened, Vb converges on VCCA at a predetermined time constant and thus the disconnection detection can be performed without any problem. However, to speedup the analog/digital conversion circuit block, the sampling period should not be preferably lengthened. The sampling period by ADC can be lengthened only during disconnection detection. However, in this case, the time required for disconnection detection significantly increases as the multichannel progresses. Additionally, a dedicated control sequence using a dedicated timing clock needs to be provided separately, which may increase the circuit or complexes the control. Moreover, in the automobile application or the like, MPc and MNc may need to extract a large current which is generated by a battery and then unintentionally injected into an input port. In this case, the transistors MPc and MNc become large. Then, a time constant until Vb converges on VCCA becomes very large, and the time required for disconnection detection significantly increases.

Furthermore, such a problem becomes more prominent as accuracy is high in addition to that the multichannel progresses and the analog/digital conversion circuit block speeds up. In the configuration in FIG. 30, an error corresponding to a ratio of the resistor Ra (Ra[0] and Ra[1]) and the resistor Rb (Rb[0] and Rb[1]) occurs during the normal A/D conversion. To increase accuracy, the resistance of Rb is preferably larger than that of Ra. Then, the voltage drop due to the current IT and Rb increases and moreover a time constant for Vb to return to VCCA also increases. Reliable disconnection detection may become more difficult.

The present invention has been made in view of the above circumstances. One of the purposes is to achieve reliable disconnection detection in a semiconductor integrated circuit device with an analog/digital conversion circuit block. The other purposes and the new feature of the present invention will become clear from the description of the present specification and the accompanying drawings.

The following explains briefly the outline of an embodiment of a typical invention among the inventions disclosed in the present application.

A semiconductor integrated circuit device in accordance with an embodiment includes an input port; a first MIS transistor and a second MIS transistor in which one end of a source/drain is connected to the input port; a first wiring path for connecting a second end of the source/drain of each of the first and second MIS transistors to a first node; and an analog digital conversion circuit, and performs a first cycle and a second cycle. The input port is connected to a first power supply voltage via a first external resistor, and is also connected to an analog signal input terminal to be measured via a second external resistor whose resistance is lower than that of the first external resistor. The first MIS transistor and the second MIS transistor differ in conductivity. The analog/digital conversion circuit converts the voltage of the first node into a digital signal. The first and second cycles are executed in this order to detect the presence or absence of a disconnection in a path from the analog signal input terminal to the input port. In the first cycle, the first and second MIS transistors are turned off and the first wiring path is pre-charged to the first power supply voltage. In the second cycle, the first and second MIS transistors are turned on and the analog/digital conversion circuit operates.

when a disconnection is in this semiconductor circuit, almost no current flows through the first external resistor. It is because no electric potential difference occurs at the both ends of the first and second MIS transistors when the cycle transitions from the first cycle to the second cycle. This can reduce a conversion error of the analog/digital conversion circuit caused by the voltage drop of the first external resistor, so a reliable disconnection detection can be performed.

The following explains briefly the effect acquired by the typical invention among the inventions disclosed in the present application. In a semiconductor integrated circuit device with an analog/digital conversion circuit block, a reliable disconnection detection can be performed.

BRIEF DESCRIPTION OF THE DRAWINGS

FIGS. 4A to 4C are schematic views showing different operation modes when the T-type switch circuit in FIG. 3 is used.

DETAILED DESCRIPTION

Figure 1:
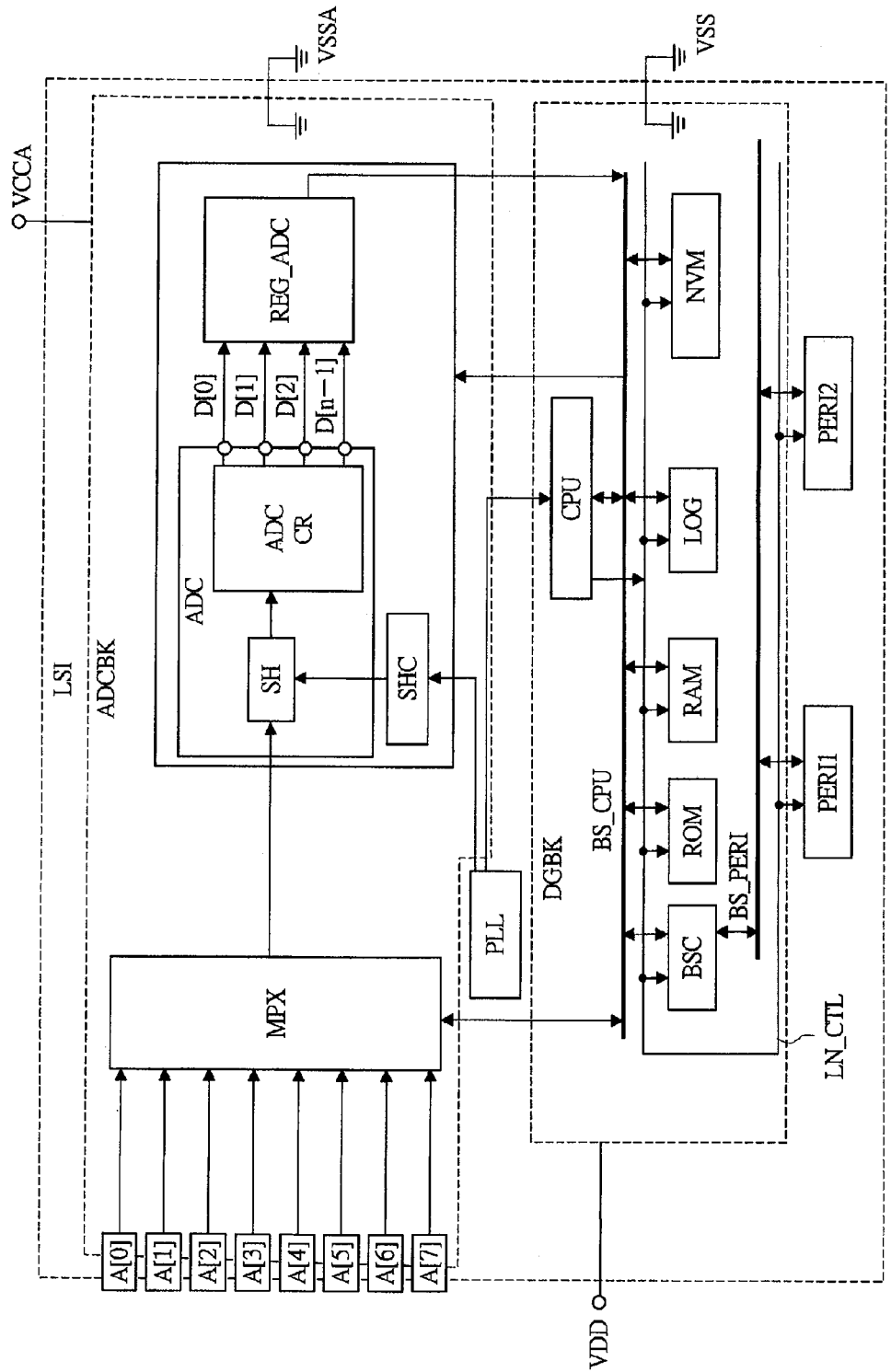
FIG. 1 is a block diagram showing a configuration of a semiconductor integrated circuit device in accordance with Embodiment 1 of the present invention.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another. In the following embodiments, when referring to the number of elements (including the number, a numeric value, an amount, and a range), they may be not restricted to the specific number but may be greater or smaller than the specific number, except for the case where they are clearly instructed in particular and where they are clearly restricted to a specific number theoretically.

Furthermore, in the following embodiments, element (including an element step) is not necessarily indispensable, except for the case where it is clearly instructed in particular and where it is considered to be clearly indispensable from a theoretical point of view. Similarly, in the following embodiments, when shape, position relationship, or the like of an element are referred to, what resembles or is similar to the shape substantially shall be included, except for the case where it is clearly specified in particular and where it is considered to be clearly not right from a theoretical point of view. This statement also applies to the numeric value and range described above.

Furthermore, the circuit elements constituting each functional block of the embodiments are not limited in particular, but can be formed over a semiconductor substrate including single crystal silicon or the like by using the integrated circuit technology for CMOS (complementary MOS transistor) or the like. Meanwhile, in the embodiments, as a MISFET (Metal Insulator Semiconductor Field Effect Transistor), a MOSFET (Metal Oxide Semiconductor Field Effect Transistor) (simply referred to as MOS transistor) is used, but, as the gate insulating film, non-oxide films shall not be excluded. In the drawings, a round mark is attached to the gate of a P-channel MOS transistor (PMOS transistor) to be distinguished from an N-channel MOS transistor (NMOS transistor). In the drawings, the connection for the substrate electric potential of MOS transistors is not shown in particular, but as long as the MOS transistors are biased in a normally operable range, the connection method is not limited in particular.

Hereinafter, the embodiments of the present invention will be described in detail with reference to the accompanying drawings. In all the drawings for explaining embodiments, the same symbol is attached to the same member, as a principle, and the repeated explanation is omitted.

Embodiment 1

Configuration of a Semiconductor Integrated Circuit Device

FIG. 1 is a block diagram showing a configuration in a semiconductor integrated circuit device in accordance with Embodiment 1 of the present invention. A semiconductor integrated circuit device LSI in FIG. 1 is a MCU formed over one semiconductor chip, and includes an analog/digital conversion circuit block ADCBK, a digital circuit block DGBK, a clock signal generation circuit PLL, and peripheral circuits PERI1 and PERI2. A digital power supply voltage VDD and a digital ground power supply voltage VSS are supplied to DGBK from external terminals. An analog power supply voltage VCCA and an analog ground power supply voltage VSSA are supplied to ADCBK from external terminals. Although not limited in particular, VCCA is set to 5 V and VDD is set to 1.5 V.

DGBK includes a processor circuit CPU, and a read only memory ROM, a random access memory RAM, a logic circuit LOG, a nonvolatile memory (such as flash memory) NVM, which are connected between DGBK and CPU via a CPU bus BS_CPU. Moreover, the DGBK includes a peripheral bus BS_PERI to which PERI1 and PERI2 are connected and a bus controller circuit BSC for controlling communications between BS_CPU and BS_PERI. CPU, which operates on receiving a clock signal from PLL, controls ROM, RAM, LOG, NVM, PERI1, and PERI2 via a control line LN_CTL as required.

ADCBK includes a multiplexer circuit MPX, an analog/digital conversion circuit ADC, a data register REG_ADC, and a sample and hold control circuit SHC. MPX selects one channel among multiple (eight)) channels of external terminals (input ports) A[0] to A[7], and outputs the signal to ADC. ADC includes a sample and hold circuit SH and an ADC core circuit ADCCR. SH holds the analog signal of a channel selected by MPX, by means of a capacitor or the like. SHC controls a hold period (sampling period) in SH in response to the clock signal from PLL. Although not limited in particular, the sampling period is 1 µs/channel.

ADCCR includes a comparator circuit, converts the analog signal held by SH into an n-bit digital signal D[0], D[1], ..., D[n−1], and stores the digital signal into the REG_ADC. CPU or the like reads the stored digital signal via BS_CPU, as required. The configuration of ADCCR is not limited in particular, but an SAR (successive approximation) type, a delta-sigma type, a pipeline type, and the like are typically known. Although not limited in particular, CPU controls the operation sequence of ADCBK via BS_CPU, as required. CPU causes MPX to select one channel by properly controlling each switch circuit included in MPX, or to select one channel by sequentially switching each channel for each sampling period. Furthermore, CPU causes MPX to perform a predetermined control due to disconnection detection, the detail of which will be described later. Moreover, CPU performs the setting or the like of the sampling period, with respect to SHC. These operation sequences can be controlled by a sequencer circuit or the like being mounted in the ADCBK. The sequencer circuit executes a plurality of operation sequences. CPU performs the designation or the like of the operation sequence, with respect to the sequencer circuit or the like.

Figure 2:
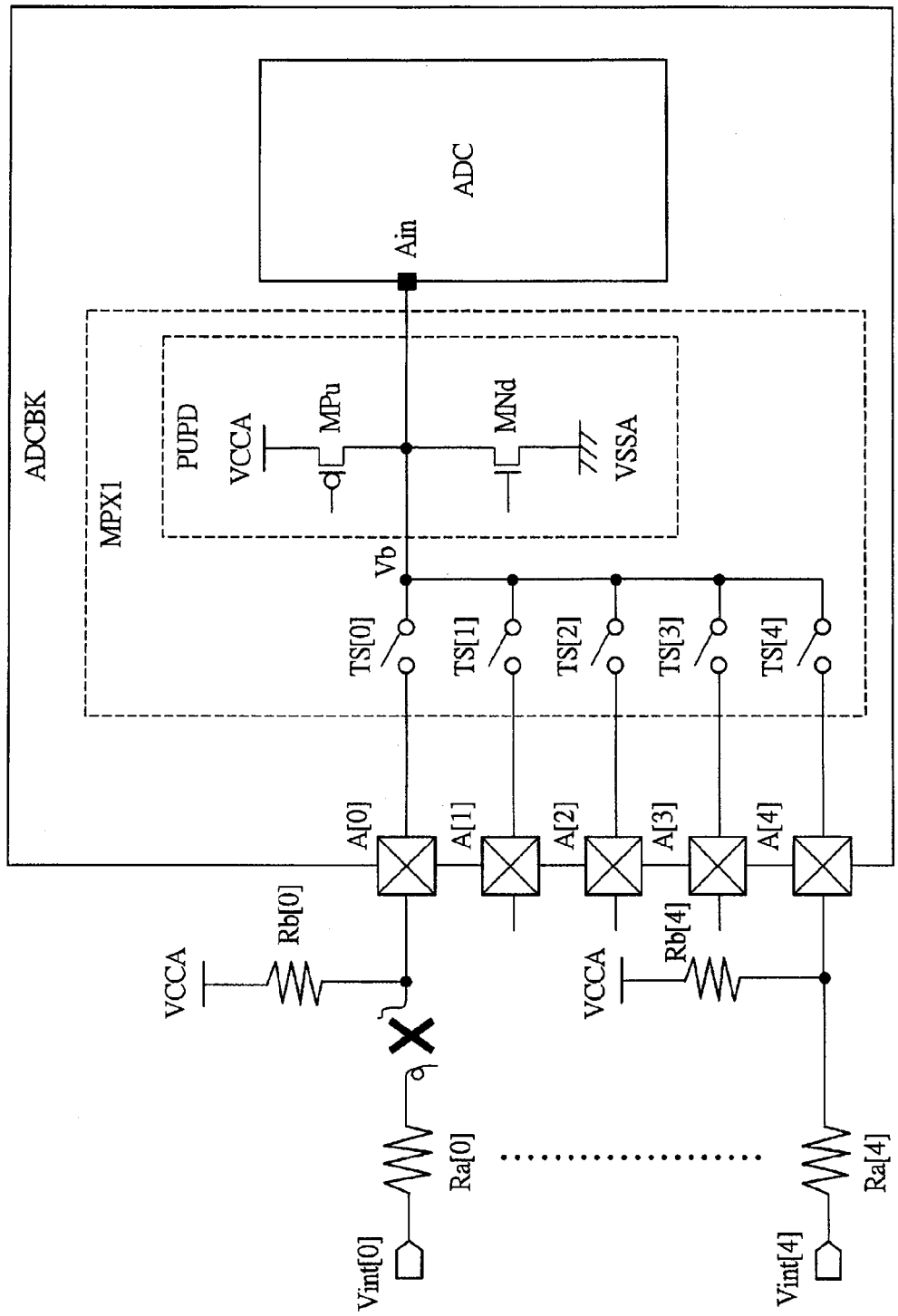
FIG. 2 is a schematic diagram showing a configuration of a major portion around an analog/digital conversion circuit block included in the semiconductor integrated circuit device in accordance with Embodiment 1 of the present invention.

Configuration [1] of the Major Portion of an Analog/Digital Conversion Circuit Block FIG. 2 is a schematic diagram showing a configuration of a major portion around an analog/digital conversion circuit block included in the semiconductor integrated circuit device in accordance with Embodiment 1 of the present invention. FIG. 2 shows a configuration around the multiplexer circuit MPX in the analog/digital conversion circuit block ADCBK in FIG. 1. The analog/digital conversion circuit block ADCBK includes eight channels of input ports in FIG. 1. It includes five channels of input ports A[0] to A[4] for simplification in FIG. 2.

The multiplexer circuit MPX1 in FIG. 2 includes five T-type switch circuits TS[0] to TS[4] to connect any one of the input ports A[0] to A[4] to the input terminal Ain of the analog/digital conversion circuit ADC, the PMOS transistor MPu to pull up Ain to VCCA, and the NMOS transistor MNd to pull down Ain to VSSA. MPu and MNd constitute a pull-up/pull-down circuit PUPD. Outside the semiconductor integrated circuit device (LSI), the input port A[k] (k=0, 1, ..., and 4) is connected to the signal input terminal Vint[k] for the channel[k] via the external resistor Ra[k] for input, and is also connected to VCCA via the pull-up external resistor Rb[k]. The configuration in FIG. 2 assumes that a disconnection is between Vint[0] for the channel[0] and A[0].

Configuration and Operation of the T-type Switch Circuit

Figure 3:
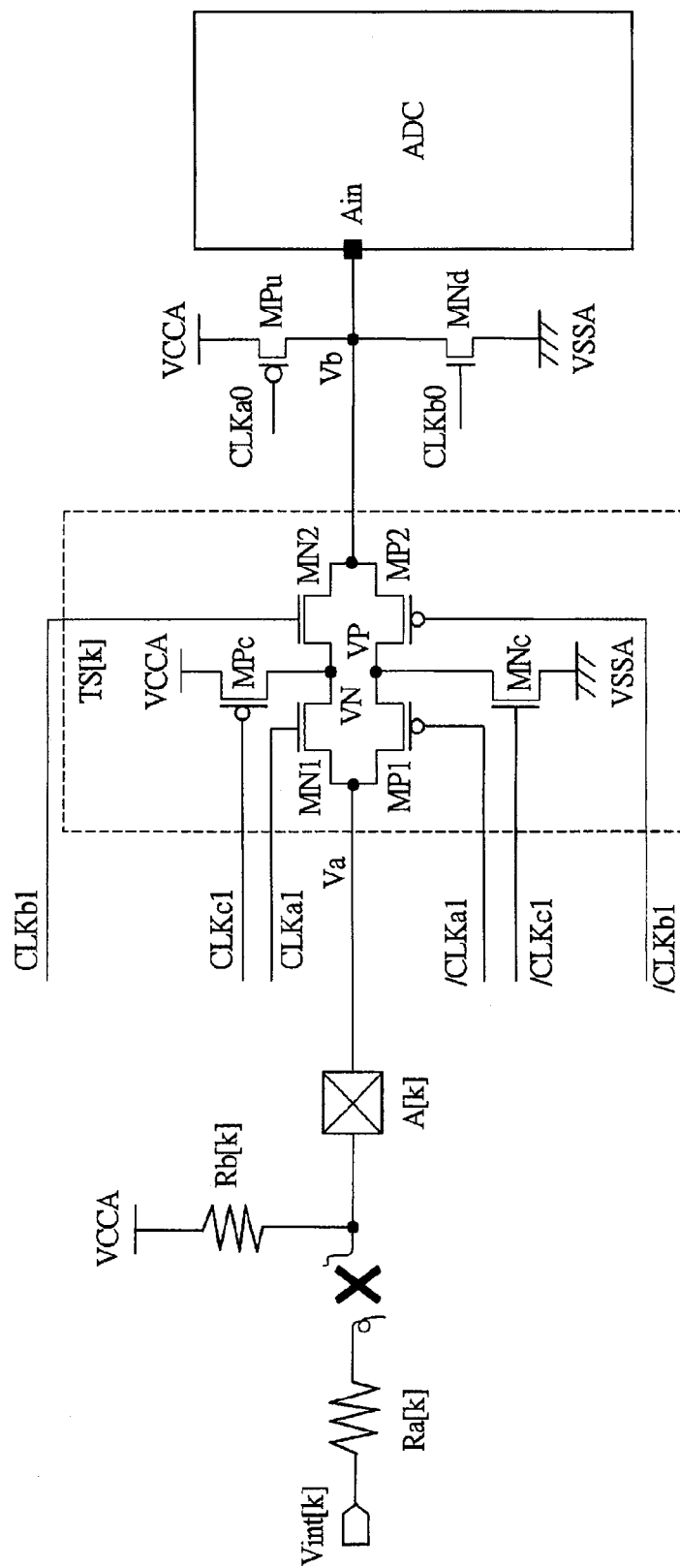
FIG. 3 is a circuit diagram showing a detailed configuration around a T-type switch circuit in the analog/digital conversion circuit block in FIG. 2.

FIG. 3 is a circuit diagram showing a detailed configuration around the T-type switch circuit in the analog/digital conversion circuit block in FIG. 2. As shown in FIG. 3, although the T-type switch circuit TS [k] included in each channel[k] includes the PMOS transistors MP1, MP2, and MPc; and NMOS transistors MN1, MN2, and MNc, like in the transistors in the T-type switch circuit TS' in FIG. 29B or 30, the on/off control signal of each transistor differs from that in TS'. In the configuration in FIG. 3, three clock signals CLKa1, CLKb1, and CLKc1 (and their inverted clock signals (/CLKa1, /CLKb1, and /CLKc1)) are supplied to the TS[k].

CLKa1 is supplied to the gate of MN1 and /CLKa1 is supplied to that of MP1. CLKb1 is supplied to the gate of MN2 and /CLKb1 is supplied to that of MP2. CLKc1 is supplied to the gate of MPc and /CLKc1 is supplied to that of MNc. Moreover, the clock signal CLKa0 is supplied to the gate of MPu constituting the pull-up/pull-down circuit PUPD, and the clock signal CLKb0 is supplied to that of MNd constituting PUPD.

If the T-type switch circuit TS[k] as shown in FIG. 3 is used, operation modes in FIGS. 4A to 4C can be realized by properly controlling each clock signal. FIGS. 4A to 4C are schematic views showing different operation modes when the T-type switch circuit in FIG. 3 is used. FIG. 4A shows an off mode in which MN1, MN2, MP1, and MP2 are turned off and MPc and MNc are turned on. In the off mode, CLKa1 and CLKb1 are at an 'L' level, and CLKc1 is at an 'L' level. In this mode, like in the T-type switch circuit TS' in FIG. 29B or 30, the voltage VN of the common connection node of MN1 and MN2 is pre-charged to VCCA and the voltage VP of the common connection node of MP and MP2 is pre-charged to VSSA.

Figure 29C:
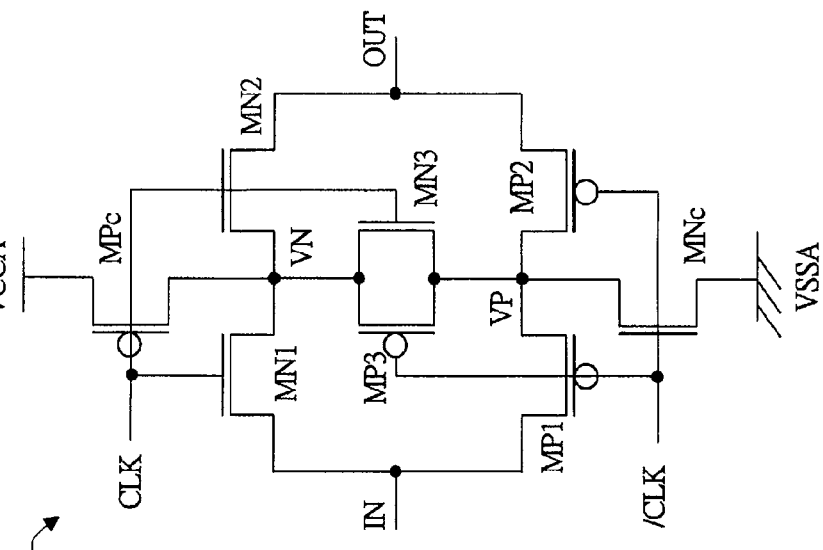
FIGS. 29A to 29C are circuit diagrams showing configurations of different switches in a semiconductor integrated circuit device which has been examined as a prerequisite of the present invention.
Figure 29B:
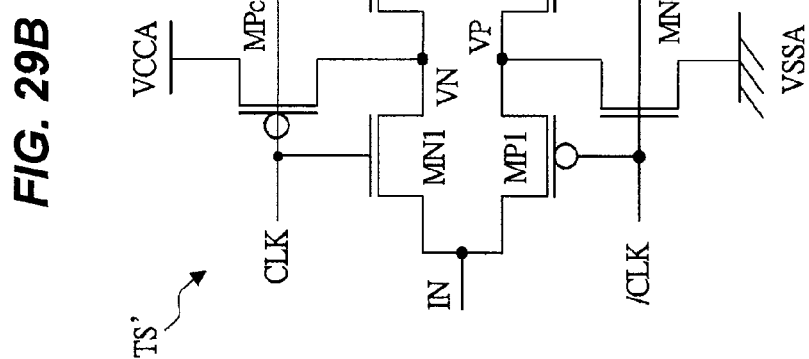
Figure 30:
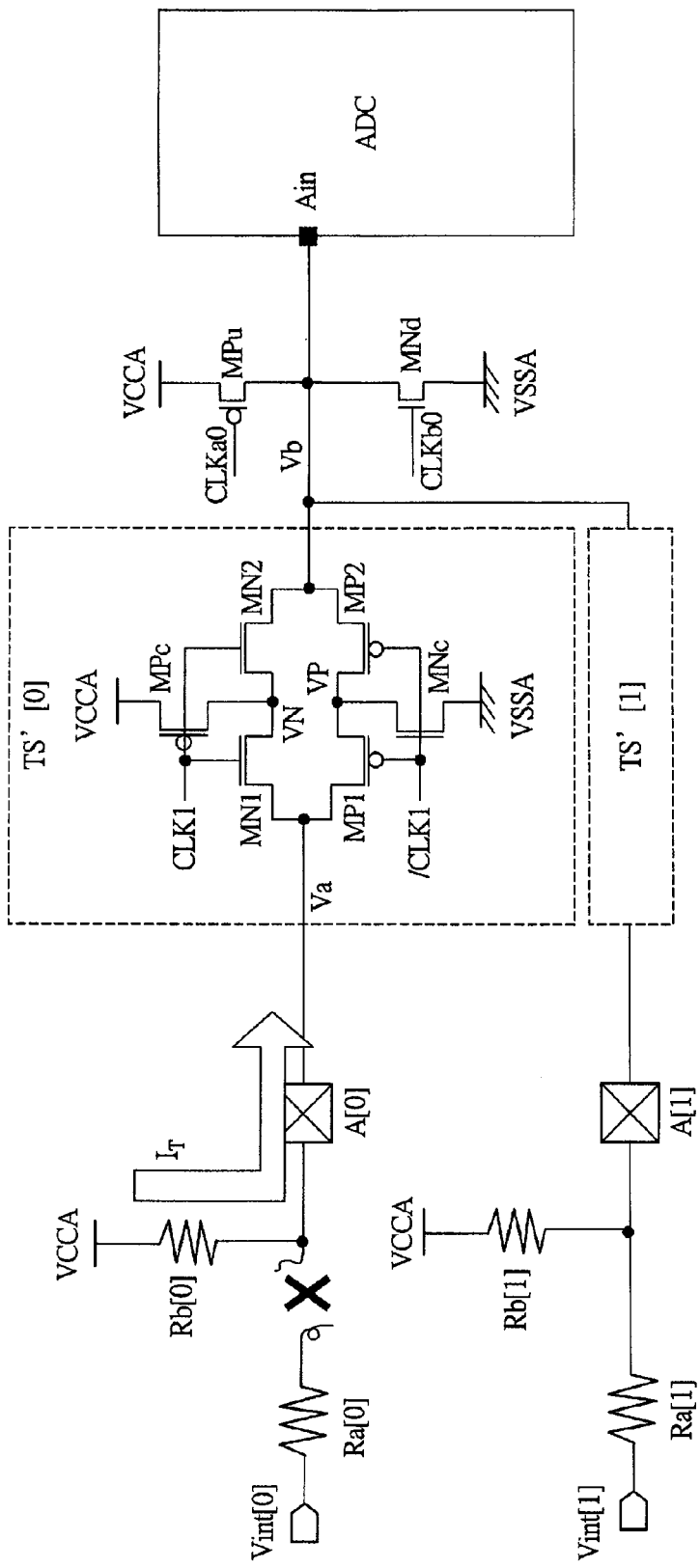
FIG. 30 is a circuit diagram showing a configuration of a major portion around an analog/digital conversion circuit block in the semiconductor integrated circuit device which has been examined as a prerequisite of the present invention.

FIG. 4C shows an on mode in which MN1, MN2, MP1, and MP2 are turned on and MPc and MNc are turned off, like in TS' of FIG. 29B or FIG. 30. In this mode, CLKa1 and CLKb1 are at an 'H' level and CLKc1 is at an 'H' level. FIG. 4B shows a disconnection detection assist mode, which cannot be realized by TS' in FIG. 29B or FIG. 30. In the disconnection detection assist mode, the MN1, MP1, MPc, and MNc are turned off and MN2, MP2 are turned on. In this mode, CLKa1 is at an 'L' level, and CLKb1 and CLKc1 are at an 'H' level. This figure uses three clock signals, but, as shown in FIGS. 4A to 4C, depending on the circumstances, CLKb1 and CLKc1 can be coupled. Then, the clock signals are as follows: the coupled signal and CLKa1.

Figure 5:
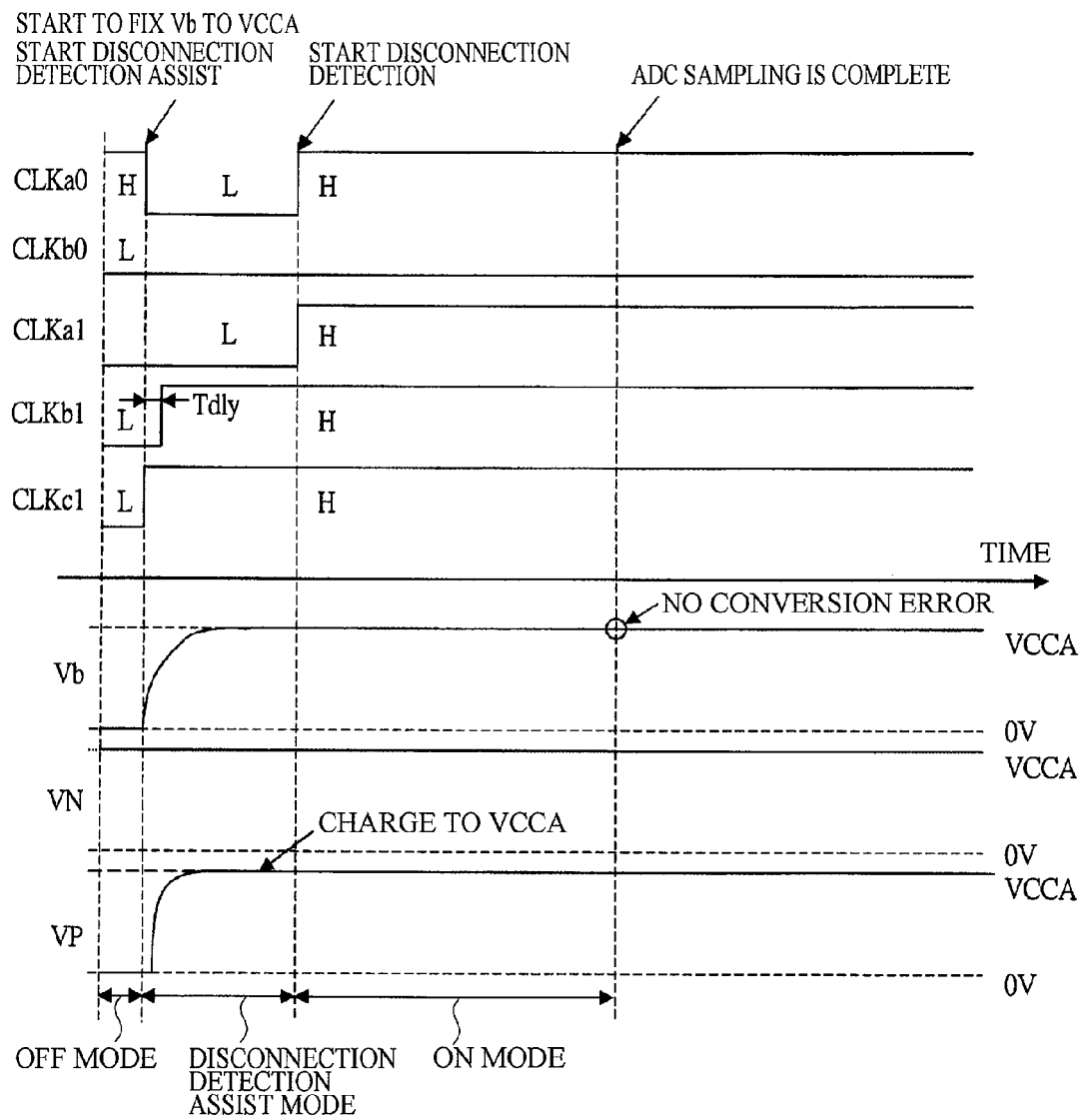
FIG. 5 is a waveform chart showing an operation during disconnection detection in the analog/digital conversion circuit block in FIG. 2.

Operation [1] of the Major Portion of the Analog/Digital Conversion Circuit Block FIG. 5 is a waveform chart showing an operation during disconnection detection in the analog/digital conversion circuit block in FIG. 2. As shown in FIG. 5, during disconnection detection, the T-type switch circuit TS[k] transitions from the off mode to the on mode via the disconnection detection assist mode. When TS[k] is in the off mode, MPu and MNd in the pull-up/pull-down circuit PUPD are also off and the voltage Vb of the input terminal Ain of ADC is unstable. However, usually, in the preceding phase, to reset the value of Ain associated with the previous measurement, Vb is driven to the VSSA level via MNd. Moreover, when TS[k] is in the off mode, as described above, the voltage VN is set to VCCA and the voltage VP is set to VSSA.

Next, TS[k] transitions to the disconnection detection assist mode. In this mode, CLKa0 in PUPD is driven to an 'L' level and Vb is pulled up to VCCA via MPu. Moreover, because MP2 is turned on in TS[k], VP is also charged to VCCA via MPu and MP2. As a result, Vb, VN, and VP are all set to VCCA. When TS[k] transitions from the off mode to the disconnection detection assist mode, as shown in FIG. 5, the change in CLKb1 is preferably delayed by a time Tdly from the change in CLKc1 (MN2 and MP2 are turned after MNc and MPc are turned off). This can prevent the short-circuit between VCCA and VSSA. With this respect, while two clock signals are possible as described above, three clock signals are more preferable. Two clock signals are also possible by providing a delay circuit, delaying CLKc1, and then generating CLKb1.

Figure 31:
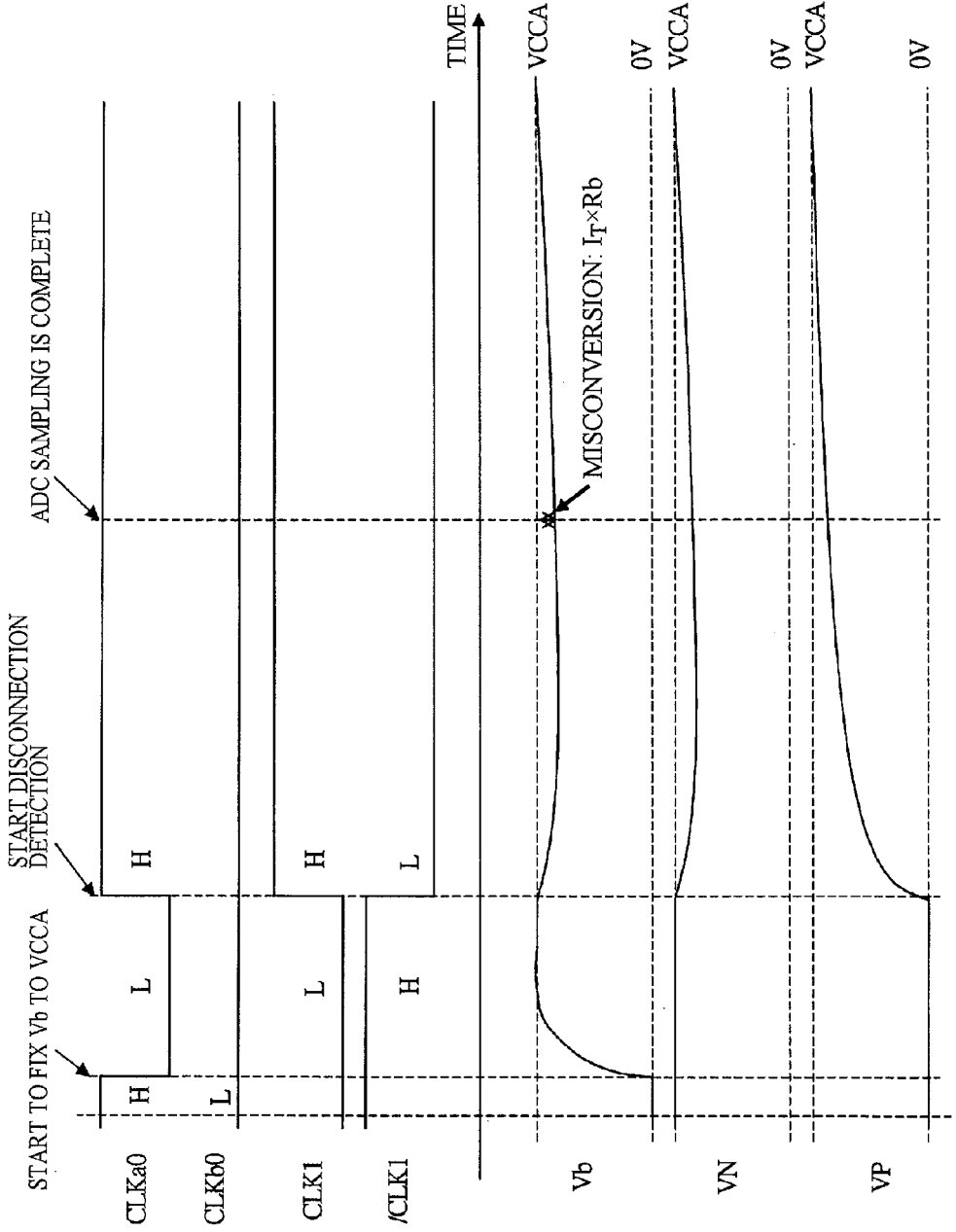
FIG. 31 is a waveform chart showing an operation in performing disconnection detection using the configuration in FIG. 30.

Next, TS[k] transitions to the on mode. In the on mode, MPu and MNd in PUPD are turned off and the input port A[k] is connected to Ain via TS[k]. Because the voltage Va of A[0] in which a disconnection exits is set to VCCA via Rb[0] and additionally, along with the disconnection detection assist mode, VP is also set to VCCA, not VSSA, no charging current via Rb[0] in FIG. 31 flows. As a result, neither a voltage drop via Rb[0] nor a conversion error by ADC occurs. By A/D conversion of Vb by ADC, a digital code of VCCA is output. This result indicates the presence of a disconnection. If no disconnection is in the channel[k], Vb is Vint[k] because typically Ra[k] (0 to 1 KΩ) is lower than Rb[k] (1 MΩ). By A/D conversion of this value, a digital code of Vint[k] is output and the absence of a disconnection is determined.

Major Effects from Embodiment 1

As described above, the disconnection detection assist mode is provided and the intermediate nodes (VN, VP) of the T-type switch circuit are set to VCCA. This can prevent the voltage drop (IR drop) that is due to Rb[k] of a high resistance when a disconnection exists. As a result, a wrong determination of the presence or absence of a disconnection can be prevented and a reliable disconnection detection can be achieved. Furthermore, because the sampling period due to disconnection detection need not to be lengthened, it is possible to contribute to speeding up the analog/digital conversion circuit block ADCBK. In addition, because the resistance of Rb[k] can be also further heightened, it is also possible to contribute to increasing the accuracy of ADCBK.

The pull-up/pull-down circuit PUPD is provided for disconnection detection, but PUPD can be also used except during disconnection detection. It can be used to reset the charge on each path, which remains due to the A/D conversion in the previous cycle, or to confirm the operation of ADC by setting Ain to VCCA or VSSA. Moreover, in the disconnection detection assist mode in FIG. 4B, MPc and MNc are turned off, but MPc and MNc can be turned on depending on circumstances. However, it is more preferable to turn off MPc and MNc to simplify the control because MPc and MNc require their own separate clock signals.

The T-type switch circuit is assumed, but the embodiment is not necessarily limited to this circuit. An essential characteristic of the embodiment is as follows: Both ends of a first transistor switch one end of which is connected to the input port A[k] have the same electric potential when disconnection detection starts. Another essential characteristic is as follows: Even if a second transistor switch is on the path between the first transistor switch and Ain, both ends of the second transistor switch have the same electric potential. This prevents a current from flowing through Rb[k] with a high resistance when each transistor switch is turned on.

Embodiment 2

Figure 6:
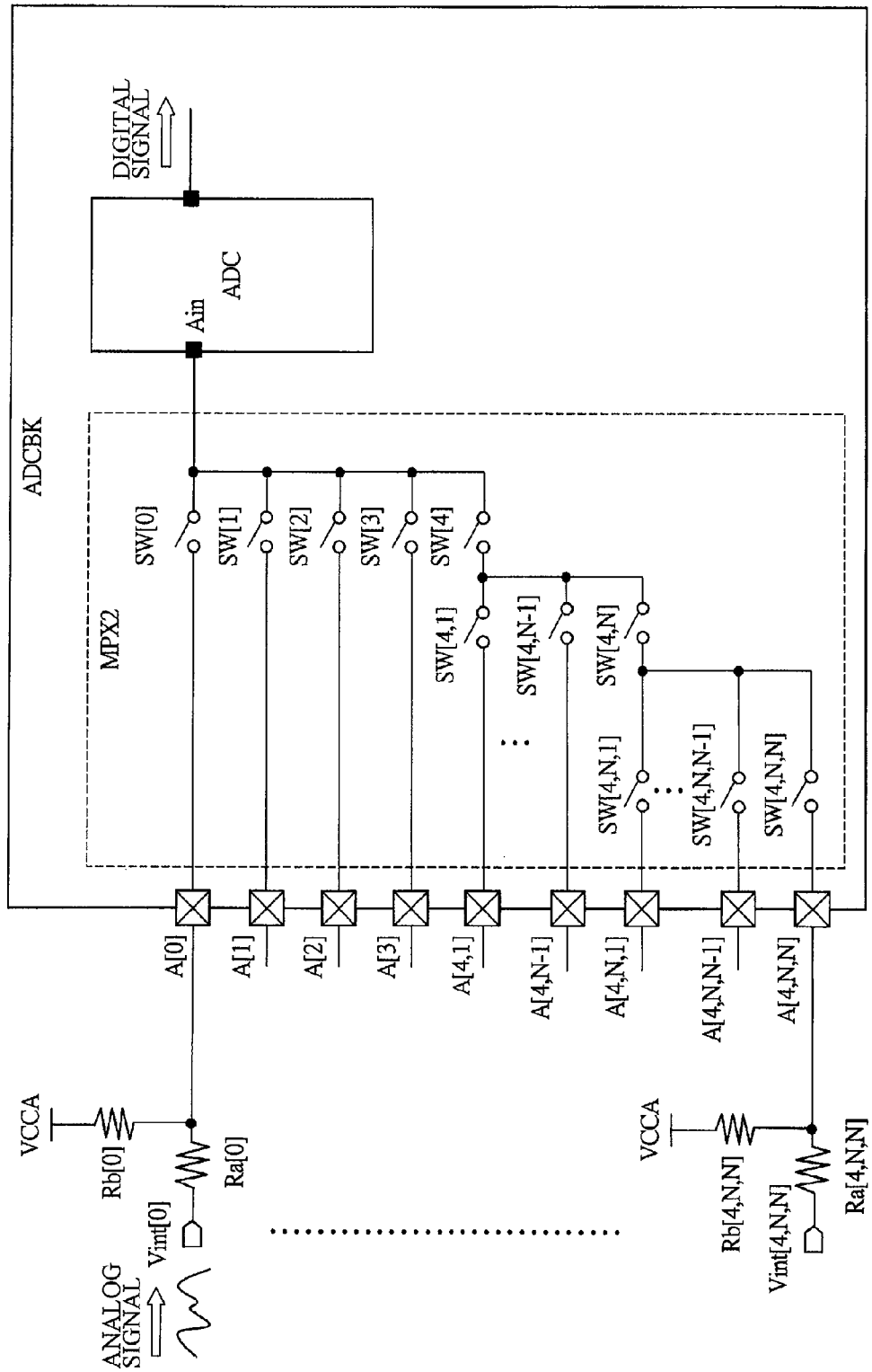
FIG. 6 is a schematic diagram showing a configuration of a major portion around an analog/digital conversion circuit block included in a semiconductor integrated circuit device in accordance with Embodiment 2 of the present invention.

Configuration [2] of the Major Portion of the Analog/Digital Conversion Circuit Block FIG. 6 is a schematic diagram showing a configuration of a major portion around an analog/digital conversion circuit block included in a semiconductor integrated circuit device in accordance with Embodiment 2 of the present invention. FIG. 6 shows a configuration around the multiplexer circuit MPX in the analog/digital conversion circuit block ADCBK in FIG. 1. In FIG. 2, each input port is connected to the input terminal Ain of the analog/digital conversion circuit ADC via one T-type switch circuit TS[k]. In FIG. 6, each input port is connected to Ain via one, two, or three switch circuit(s).

In a multiplexer circuit MPX2 in FIG. 6, each of four input ports A[0] to A[3] is connected to Ain via one of switch circuits SW[0] to SW[3]. (N−1) input ports A[4, 1] to A[4, N−1] are connected to one end of a common switch circuit SW[4] via one of switch circuits SW[4, 1] to SW[4, N−1], respectively, and are connected to Ain via SW[4]. These input ports are connected to Ain via two switch circuits. N input ports A[4N, 1] to A[4, N, N] are connected to one end of a common switch circuit SW[4, N] via one of switch circuits SW[4N, 1] to SW[4, N, N], respectively, and connected to one end of SW[4] via SW[4, N], and connected to Ain via SW[4]. These input ports are connected to Ain via three switch circuits.

As shown in FIG. 6, a circuit system in which input ports are branched in the shape of a tree and a switch circuit having a different hierarchical layer of the tree for each input port is used is referred to as a sub-common method. The sub-common method is useful in particular for a system, which needs many input ports and includes the channels requiring high speed and the ones which may support a low speed. In FIG. 6, for A[0] to A[3], only one switch circuit exists in the path to Ain and the number of switch circuits connected in parallel is only five. The time constant of this path is expressed as follows: Ron (the on-resistance of a switch circuit)×5CL (CL: the load capacitance of a switch circuit). This time constant, which is small, can be used as a high-speed conversion path.

In contrast, for A[4, N, 1] to A[4, N, N], in the path to Ain, there are three switch circuits and the number of switch circuits connected in parallel is (2N+5). The time constant of this path is approximately 3Ron×(2N+5)CL, and can be used as a low-speed conversion path because the time constant is large. In this manner, the ports can be grouped into A[0] to A[3] for high-speed ports, A[4, 1] to A[4, N−1] for intermediate speed ports, and A[4, N, 1] to A[4, N, N] for low-speed ports. The time constant of the high-speed port can be further reduced by using the sub-common method as compared with the case where the same number of channels is realized without using the sub-common method (with the configuration in FIG. 2), and thus the upper limit of speed can be increased.

Figure 7:
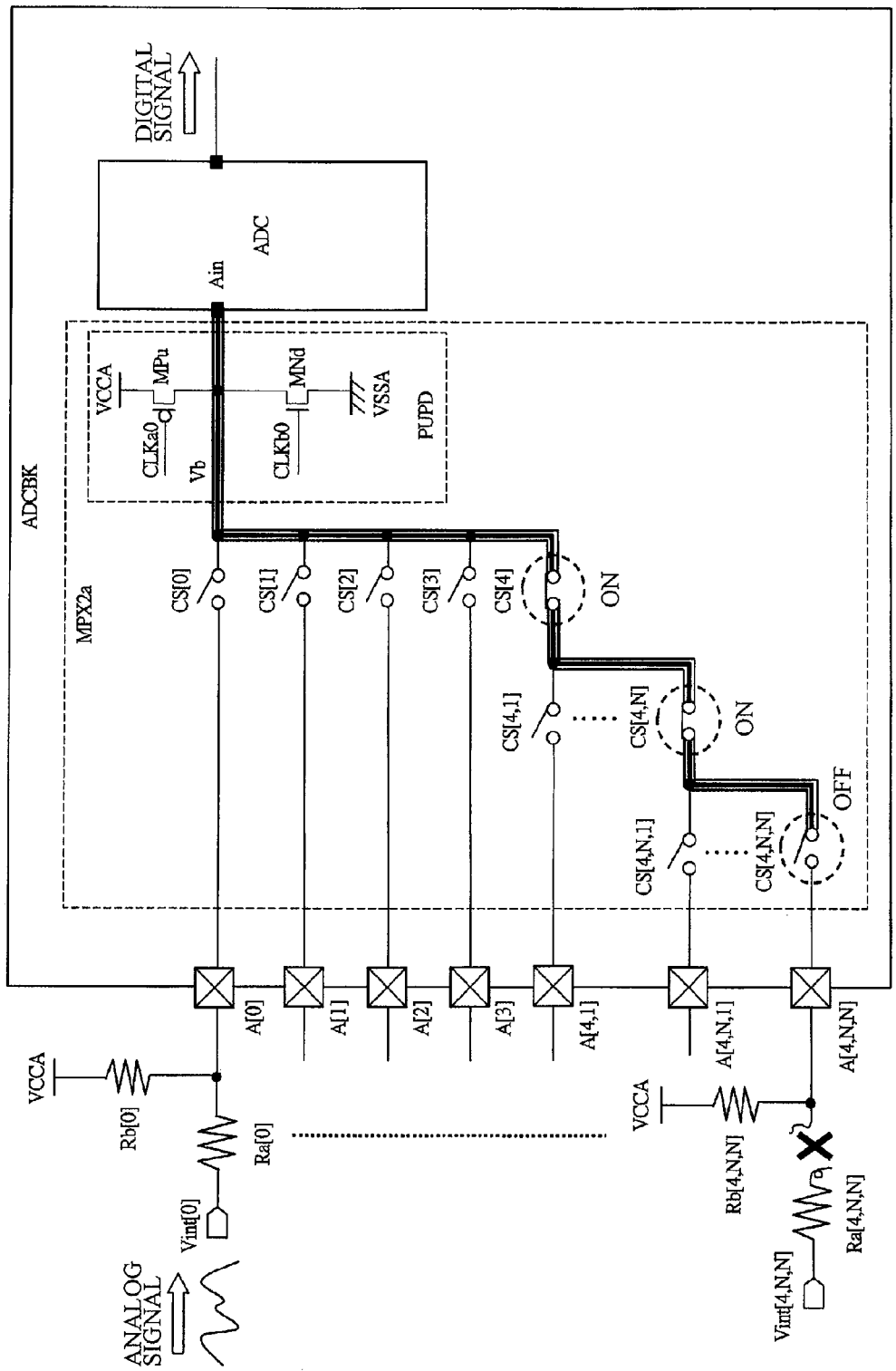
FIG. 7 is a circuit diagram showing a detailed configuration around a multiplexer circuit in the analog/digital conversion circuit block in FIG. 6.
Figure 29A:
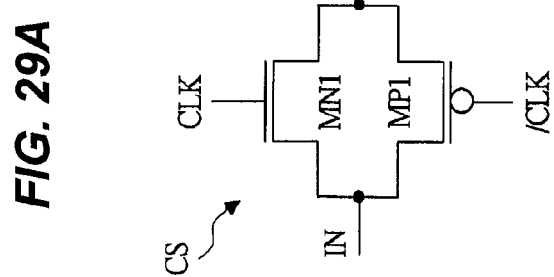

Configuration and Operation [2a] of the Major Portion of the Analog/Digital Conversion Circuit Block FIG. 7 is a circuit diagram showing a detailed configuration around the multiplexer circuit in the analog/digital conversion circuit block in FIG. 6. In a multiplexer circuit MPX2a in FIG. 7, SW[0] to SW[4], SW[4, 1] to SW[4, N], and SW[4, N, 1] to SW[4, N, N] in MPX2 of FIG. 6 comprise the CMOS switch circuits CS[0] to CS[4], CS[4, 1] to CS[4, N], and CS[4, N, 1] to CS[4, N, N] as shown in FIG. 29A, respectively. Moreover, MPX2a includes the pull-up/pull-down circuit PUPD connected to the input terminal Ain of the analog/digital conversion circuit ADC. PUPD includes the PMOS transistor MPu for pulling up Ain to VCCA in response to the clock signal CLKa0, and the NMOS transistor MNd for pulling down Ain to VSSA in response to the clock signal CLKb0.

Figure 8:
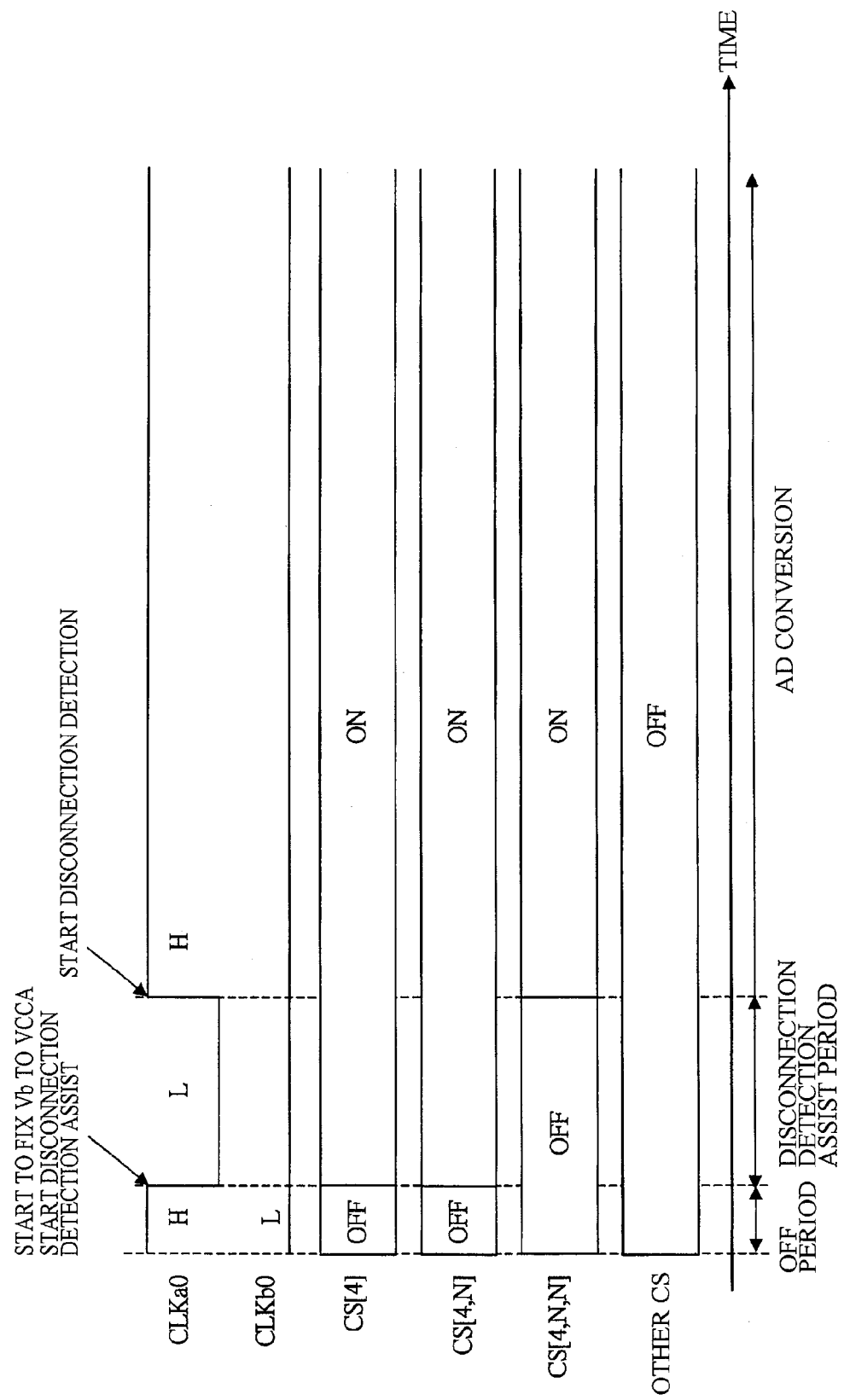
FIG. 8 is a sequence diagram showing an operation during disconnection detection in the analog/digital conversion circuit block in FIG. 7.

FIG. 8 is a sequence diagram showing an operation during disconnection detection in the analog/digital conversion circuit block in FIG. 7. This figure shows a disconnection is in an external wiring connecting to the input port [4, N, N] in FIG. 7 and this disconnection is detected. Also in the configuration employing the sub-common method using a CMOS switch circuit in FIG. 7, as with the case of Embodiment 1, when disconnection detection is started, it is useful to control not to cause an electric potential difference between both ends of each transistor switch present in the path between the input port A[k] and Ain. Then, as shown in FIG. 8, a disconnection detection assist period is provided prior to starting disconnection detection.

During the disconnection detection assist period, to charge to VCCA the path from one end of CS[4, N, N] to Ain, CS[4, N] and CS[4] are turned on and also CLKa0 is set to an 'L' level, and thus MPu in PUPD is turned on. In this case, CS[4, N, N] is off, and other switch circuits are also off to speed the charging by MPu. Then, after this disconnection detection assist period, MPu is turned off again and CS[4, N, N] is caused to transition from the off state to the on state, and thus disconnection detection is started. If a disconnection is in the external wiring connecting to the input port [4, N, N], then when this disconnection detection is started, the electric potentials of both ends of CS[4, N, N] are both already set to VCCA, and thus almost no current flows through a resistor Rb[4, N, N] currently pulling up A[4, N, N] to VCCA. As a result, almost no IR drop due to Rb[4, N, N] is caused, and thus a wrong determination of the presence or absence of a disconnection can be prevented and a reliable disconnection detection can be achieved.

As described above, by using the semiconductor integrated circuit device of Embodiment 2, the same effect as Embodiment 1 can be obtained, and additionally, an analog/digital conversion circuit block capable of securing high speed even in case of multi-channel can be realized.

Embodiment 3

Figure 9:
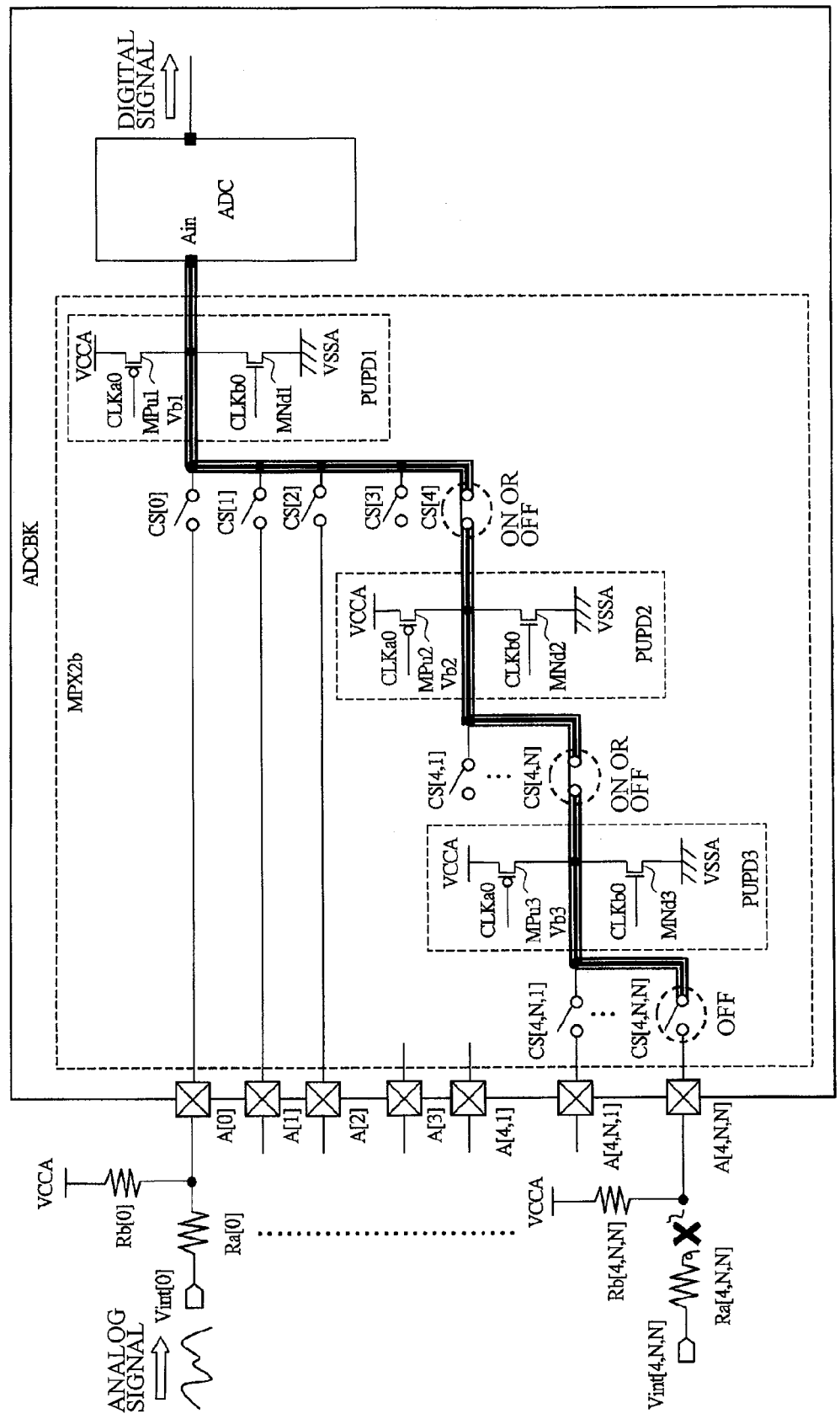
FIG. 9 is a circuit diagram showing a detailed configuration around the multiplexer circuit in the analog/digital conversion circuit block in FIG. 6, in a semiconductor integrated circuit device in accordance with Embodiment 3 of the present invention.

Configuration and Operation [2b] of the Major Portion of the Analog/Digital Conversion Circuit Block FIG. 9 is a circuit diagram showing a detailed configuration around the multiplexer circuit in the analog/digital conversion circuit block in FIG. 6, in a semiconductor integrated circuit device according to Embodiment 3 of the present invention. A multiplexer circuit MPX2b sin FIG. 9 differs from the multiplexer circuit MPX2a of FIG. 7 in that it includes three pull-up/pull-down circuits PUPD1-PUPD3. Each of PUPD1 to PUPD3 includes the pull-up PMOS transistor MPu controlled by the clock signal CLKa0 and the pull-down NMOS transistor MNd controlled by the clock signal CLKb0, as in FIG. 7. One of PUPD1 to PUPD3 is provided in each hierarchical layer of a tree associated with the above-described sub-common method. PUPD1 pulls up/down a voltage Vb1 of the input terminal Ain of ADC, as shown in FIG. 7, PUPD2 pulls up/down a voltage Vb2 of the node between the CMOS switch circuits CS[4] and CS[4, J] (j=1−N), and PUPD3 pulls up/down a voltage Vb3 of the node between CS[4, N] and CS[4, N, J].

Figure 10:
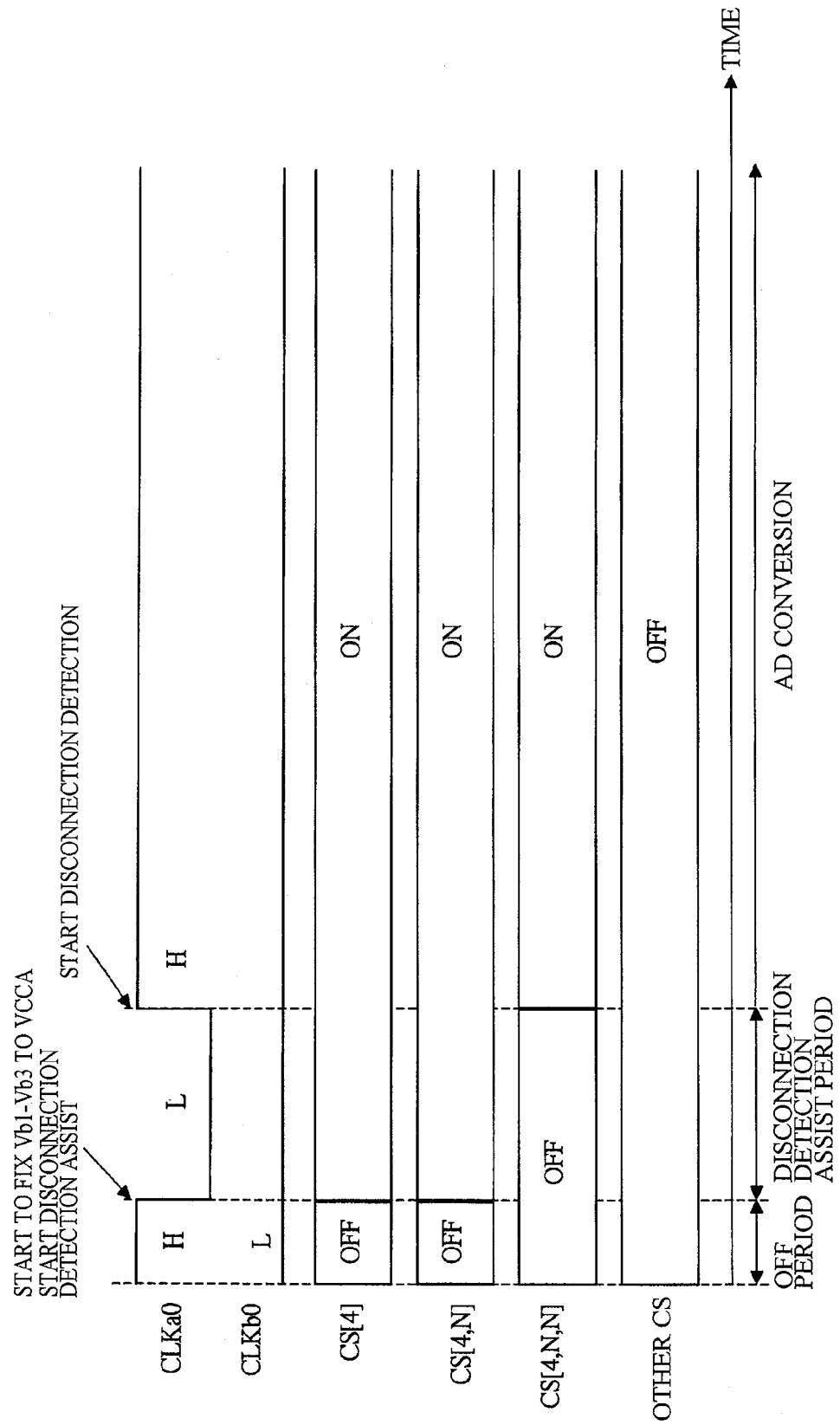
FIG. 10 is a sequence diagram showing an operation during disconnection detection in the analog/digital conversion circuit block in FIG. 9.

FIG. 10 is a sequence diagram showing an operation during disconnection detection in the analog/digital conversion circuit block in FIG. 9. This case describes that a disconnection is in an external wiring connecting to the input port [4, N, N] of FIG. 9 and this disconnection is detected. In FIG. 10, as in FIG. 8, the disconnection detection assist period is provided before the start of disconnection detection. During the disconnection detection assist period, to charge to VCCA the path from one end of CS[4, N, N] to Ain, CS[4, N] and CS[4] are turned on and also CLKa0 is set to an 'L' level, and thus all MPus in PUPD1 to PUPD3 are turned on. CS[4, N, N] is off and other switch circuits are also off. After this disconnection detection assist period, MPus in PUPD1-PUPD3 are turned off again and CS[4, N, N] is caused to transition from the off state to the on state as in FIG. 8, and thus disconnection detection is started.

If the configuration (operation in FIG. 10) in FIG. 9 is used, the length of the disconnection detection assist period can be reduced as compared with the case using the configuration (operation in FIG. 8) in FIG. 7. In the configuration in FIG. 7, a parasitic capacitance associated with three paths via two switch circuits needs to be charged by one pull-up/pull-down circuit, while in the configuration in FIG. 9, approximately one-third of this parasitic capacitance may be charged by one pull-up/pull-down circuit, and thus the charging time can be speeded up. Moreover, as another aspect, if the length of the disconnection detection assist period is the same between FIG. 9 and FIG. 7, the size of each transistor of PUPD1 can be reduced by the amount corresponding to the speeding up of the charging time. This reduces the parasitic capacitance associated with PUPD1 and can further reduce the time constant of the high-speed ports (A[0]-A[3]), and thus a further speeding-up of the analog/digital conversion circuit block can be achieved.

Figure 11:
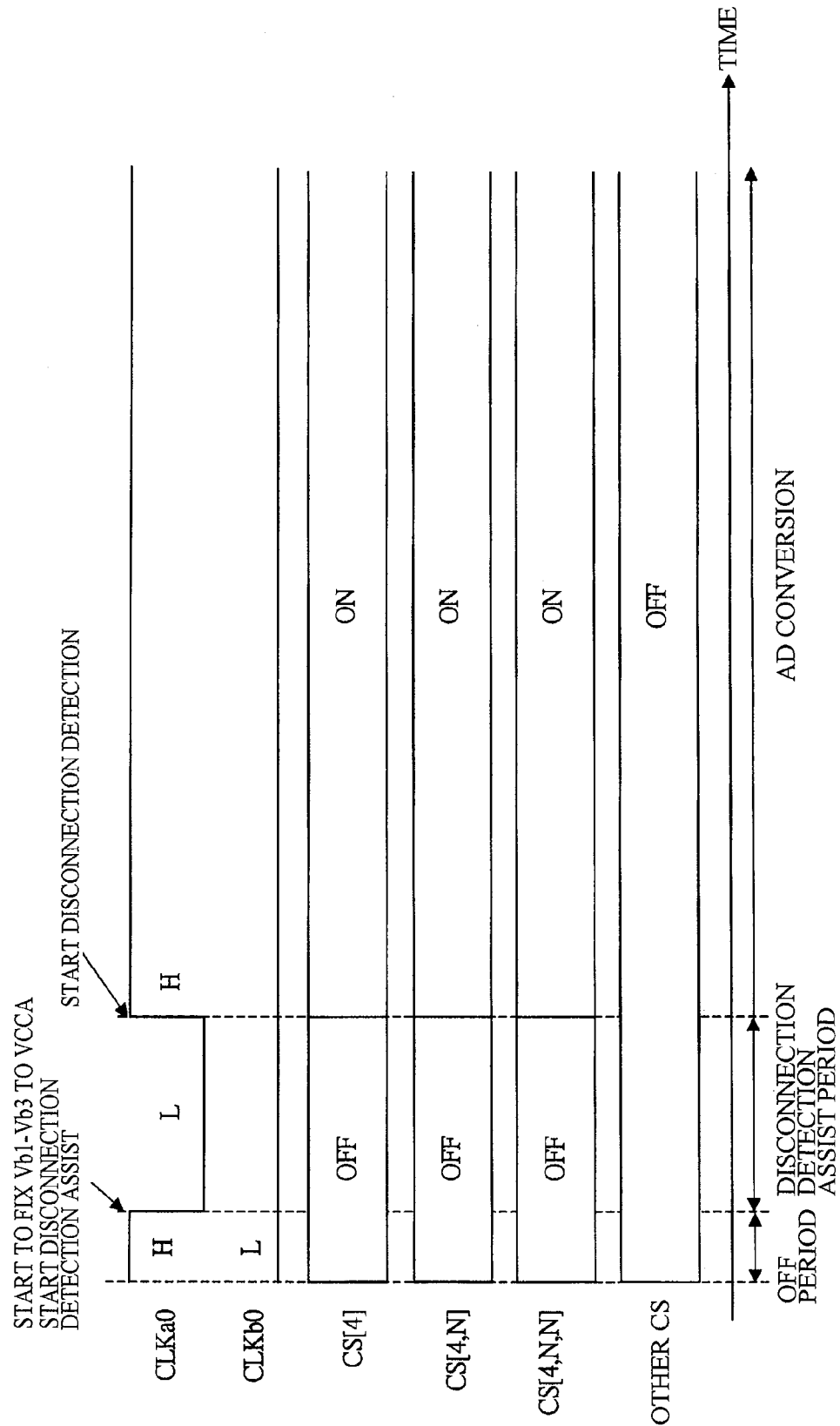
FIG. 11 is a sequence diagram showing an operation different from that in FIG. 10 during disconnection detection.

FIG. 11 is a sequence diagram showing an operation different from FIG. 10 during disconnection detection. In FIG. 10, the CMOS switch circuits CS[4] and CS[4, N] are turned on in the disconnection detection assist period, while in FIG. 11, CS [4] and CS[4, N] are turned off together with CS[4, N, N] and subsequently, CS[4], CS[4, N] and CS[4, N, N] are all turned on in starting disconnection detection. In the configuration in FIG. 9, unlike the configuration in FIG. 7, the pull-up/pull-down circuits PUPD1 to PUPD3 are provided in each path sandwiched by the switch circuits, and thus even if each switch circuit is turned off in the disconnection detection assist period, each path sandwiched by the transistor switches can be charged to VCCA. If the operation in FIG. 11 is used, the control of each CMOS switch circuit can be simplified as compared with the operation in FIG. 10. In FIG. 11, in the disconnection detection assist period, all the CMOS switch circuits may be turned off and also each pull-up/pull-down circuit may be caused to perform the pull-up operation, and when disconnection detection is started, this pull-up operation may be stopped and also all the CMOS switch circuits over the path between an input port to be detected and Ain may be turned on.

As described above, by using the semiconductor integrated circuit device of Embodiment 3, the same effect as Embodiment 2 can be obtained, and additionally, a reduction of the period required for disconnection detection or a further speeding-up of the analog/digital conversion circuit block can be achieved. The common clock signals CLKa0 and CLKb0 are provided for each of the pull-up/pull-down circuits PUPD1-PUPD3, but it is also possible to provide separate clock signals for each pull-up/pull-down circuit. In performing disconnection detection of the input port A[0], PUPD2 and PUPD3 do not necessarily need to perform the pull-up operation.

Embodiment 4

Figure 12:
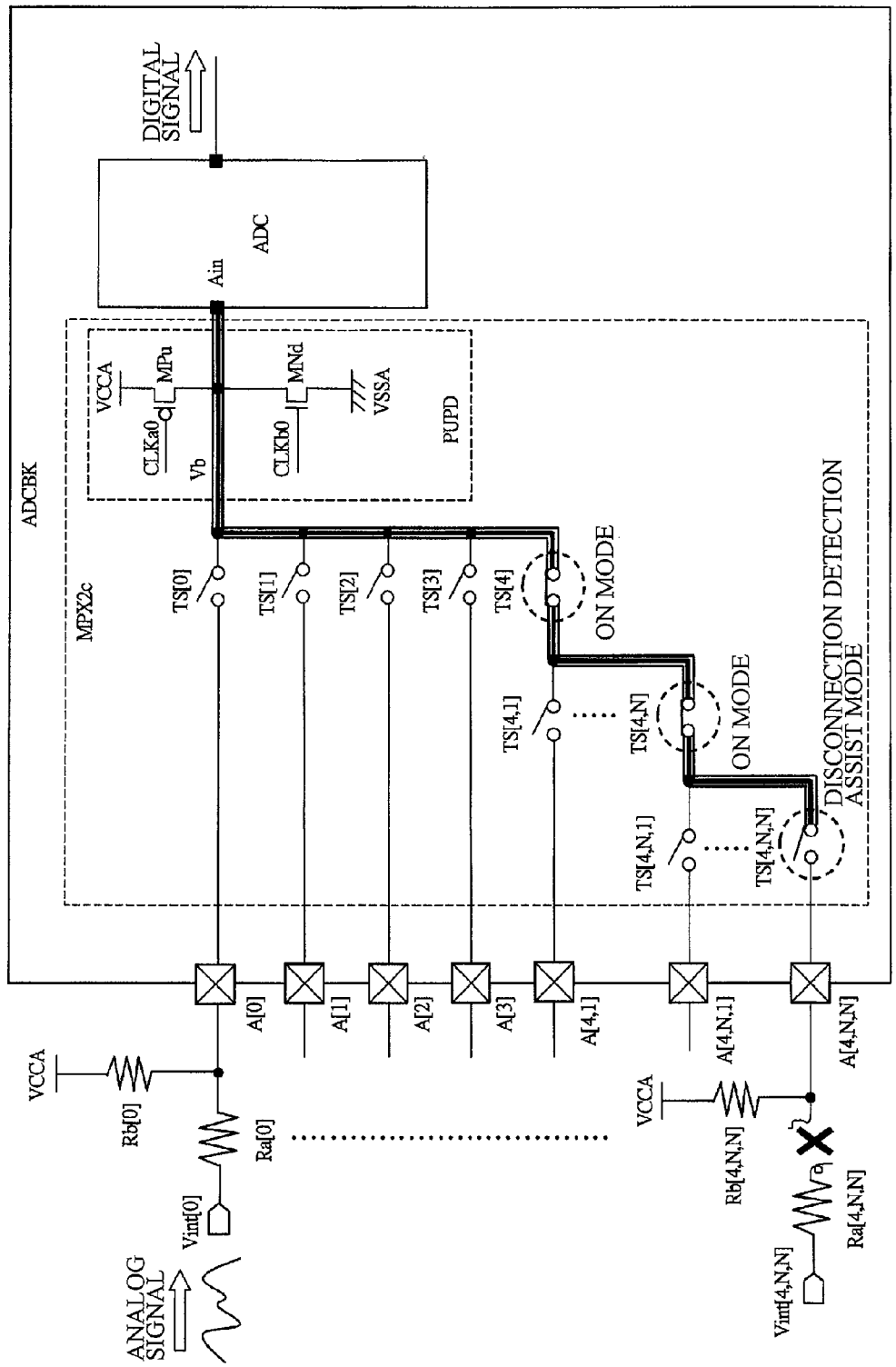
FIG. 12 is a circuit diagram showing a detailed configuration around the multiplexer circuit in the analog/digital conversion circuit block in FIG. 6, in a semiconductor integrated circuit device in accordance with Embodiment 4 of the present invention.

Configuration and Operation [2c] of the Major Portion of the Analog/Digital Conversion Circuit Block FIG. 12 is a circuit diagram showing an example of the detailed configuration around the multiplexer circuit in the analog/digital conversion circuit block of FIG. 6, in a semiconductor integrated circuit device in accordance with Embodiment 4 of the present invention. A multiplexer circuit MPX2c in FIG. 12 is a variant of FIG. 7. Each CMOS switch circuit in MPX2a in FIG. 7 is replaced with the T-type switch circuit as described in FIG. 3 and FIG. 4. MPX2c in FIG. 12 includes the pull-up/pull-down circuit PUPD, the T-type switch circuits TS[0]-TS[4], TS[4, 1]-TS[4, N], and TS[4N, 1]-TS[4, N, N].

Figure 13:
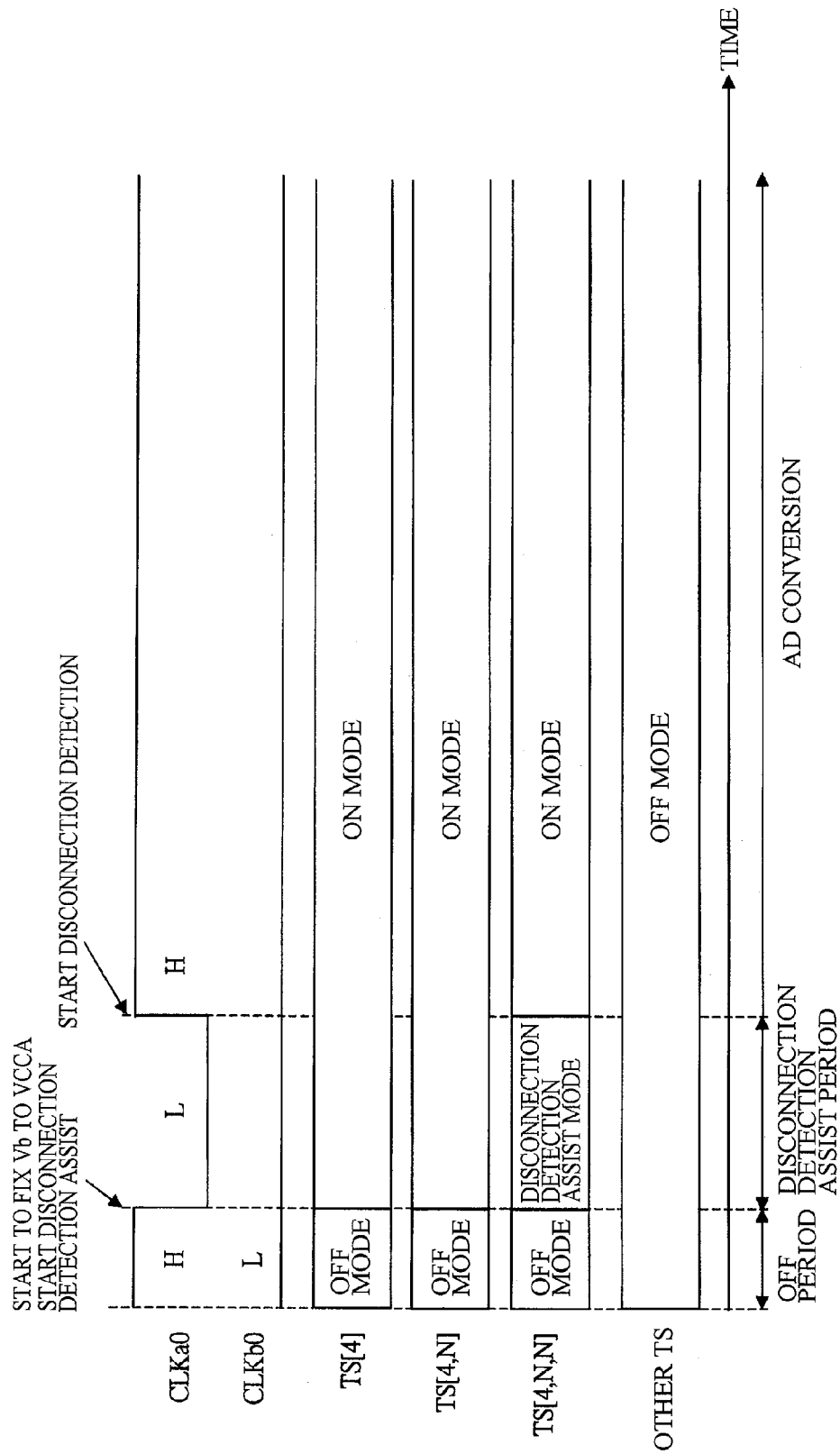
FIG. 13 is a sequence diagram showing an operation during disconnection detection in the analog/digital conversion circuit block in FIG. 12.

FIG. 13 is a sequence diagram showing an operation during disconnection detection in the analog/digital conversion circuit block in FIG. 12. A disconnection is in an external wiring connecting to the input port [4, N, N] in FIG. 12 and this disconnection is detected. In FIG. 13, first, as the initial state, the PMOS transistor MPu and the NMOS transistor MNd in PUPD are turned off associated with the 'H' level of the clock signal CLKa0 and the 'L' level of the clock signal CLKb0, and also each T-type switch circuit is controlled to the off mode. In the off mode, as shown in FIG. 4A, the voltages VN and VP of each intermediate node in the T-type switch circuit are fixed to VCCA and VSSA, respectively.

Next, the state transitions to the disconnection detection assist period. During the disconnection detection assist period, CLKa0 transitions to the 'L' level and the pull-up operation via MPu is performed. TS[4] and TS[4, N] are controlled to the on mode shown in FIG. 4C, and TS[4, N, N] is controlled to the disconnection detection assist mode shown in FIG. 4B. Thus, the other end (corresponding to the voltages VN and VP) of the transistor (corresponding to MN1, MP1 of FIG. 4B) whose end is connected to A[4, N, N] in TS[4, N, N] is pre-charged to VCCA. Subsequently, by stopping the pull-up operation via MPu and also causing TS[4, N, N] to transition to the on mode, the disconnection detection using the analog/digital conversion circuit ADC is started. At the beginning, almost no IR drop via the resistor Rb[4, N, N] is caused because an electric potential difference is not generated between both ends of each of MN1, MP1 in TS[4, N, N]. As a result, a wrong determination of the presence or absence of a disconnection can be prevented and a reliable disconnection detection can be achieved.

As described above, by using the semiconductor integrated circuit device of Embodiment 4, the same effect as Embodiment 2 can be obtained. Moreover, as compared with Embodiment 2, the T-type switch circuit is used here, and thus as described in FIG. 30, a leak or the like between channels during the normal A/D conversion operation can be reduced, and the conversion accuracy of ADC can be improved.

Embodiment 5

Figure 14:
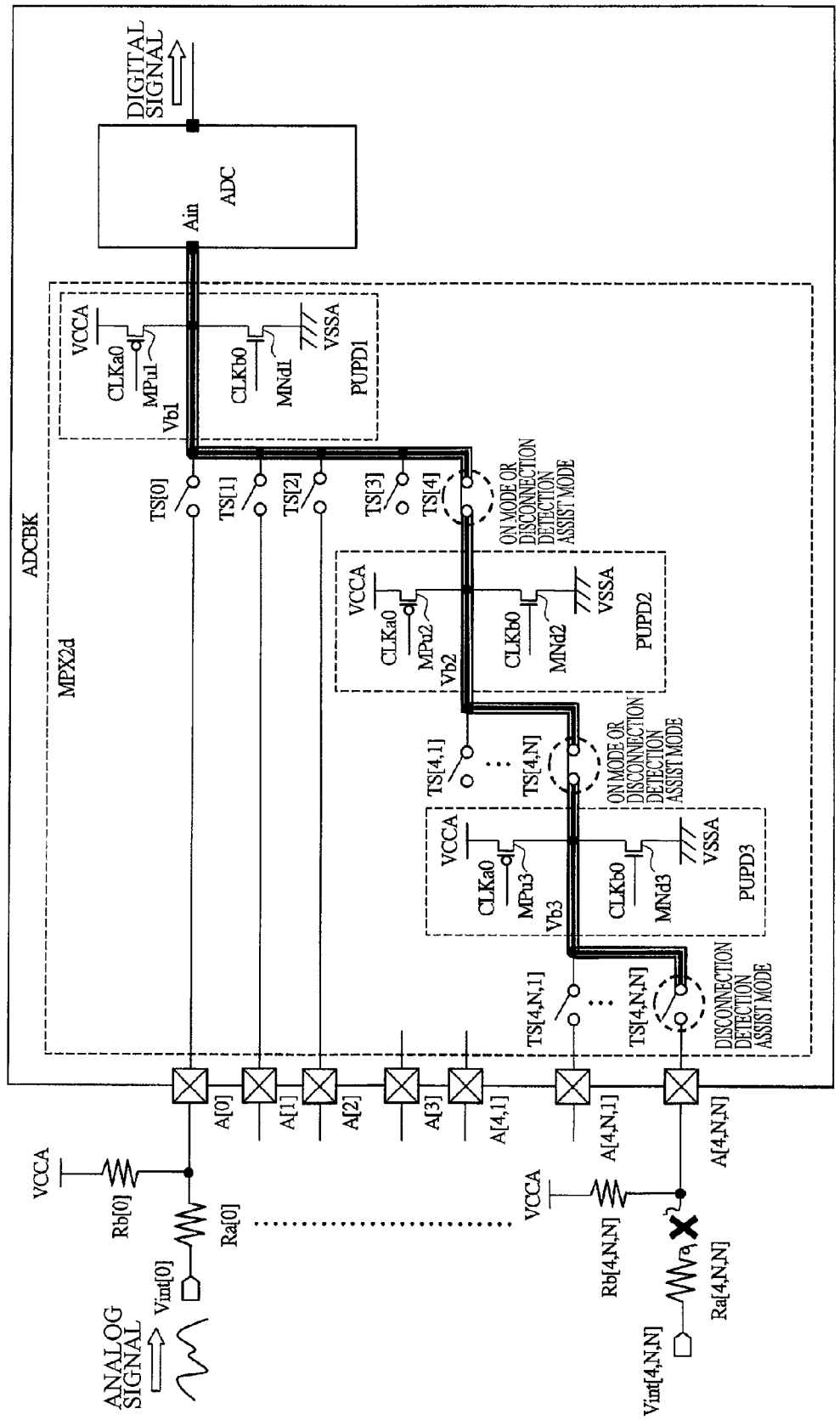
FIG. 14 is a circuit diagram showing a detailed configuration around the multiplexer circuit in the analog/digital conversion circuit block in FIG. 6, in a semiconductor integrated circuit device in accordance with Embodiment 5 of the present invention.

Configuration and Operation [2d] of the Major Portion of the Analog/Digital Conversion Circuit Block FIG. 14 is a circuit diagram showing a detailed configuration around the multiplexer circuit in the analog/digital conversion circuit block of FIG. 6, in a semiconductor integrated circuit device in accordance with Embodiment 5 of the present invention. A multiplexer circuit MPX2d shown in FIG. 14 differs from the multiplexer circuit MPX2c of FIG. 12 in that it includes three pull-up/pull-down circuits PUPD1 to PUPD3. Each of PUPD1 to PUPD3, as in FIG. 12, includes the pull-up PMOS transistor MPu controlled by the clock signal CLKa0 and the pull-down NMOS transistor MNd controlled by the clock signal CLKb0. PUPD1 pulls up/down the voltage Vb1 of the input terminal Ain of ADC, as in FIG. 12, PUPD2 pulls up/down the voltage Vb2 of the node between the T-type switch circuit TS[4] and TS[4, J] (j=1–N), and PUPD3 pulls up/down the voltage Vb3 of the node between TS[4, N] and TS[4, N, J].

Figure 15:
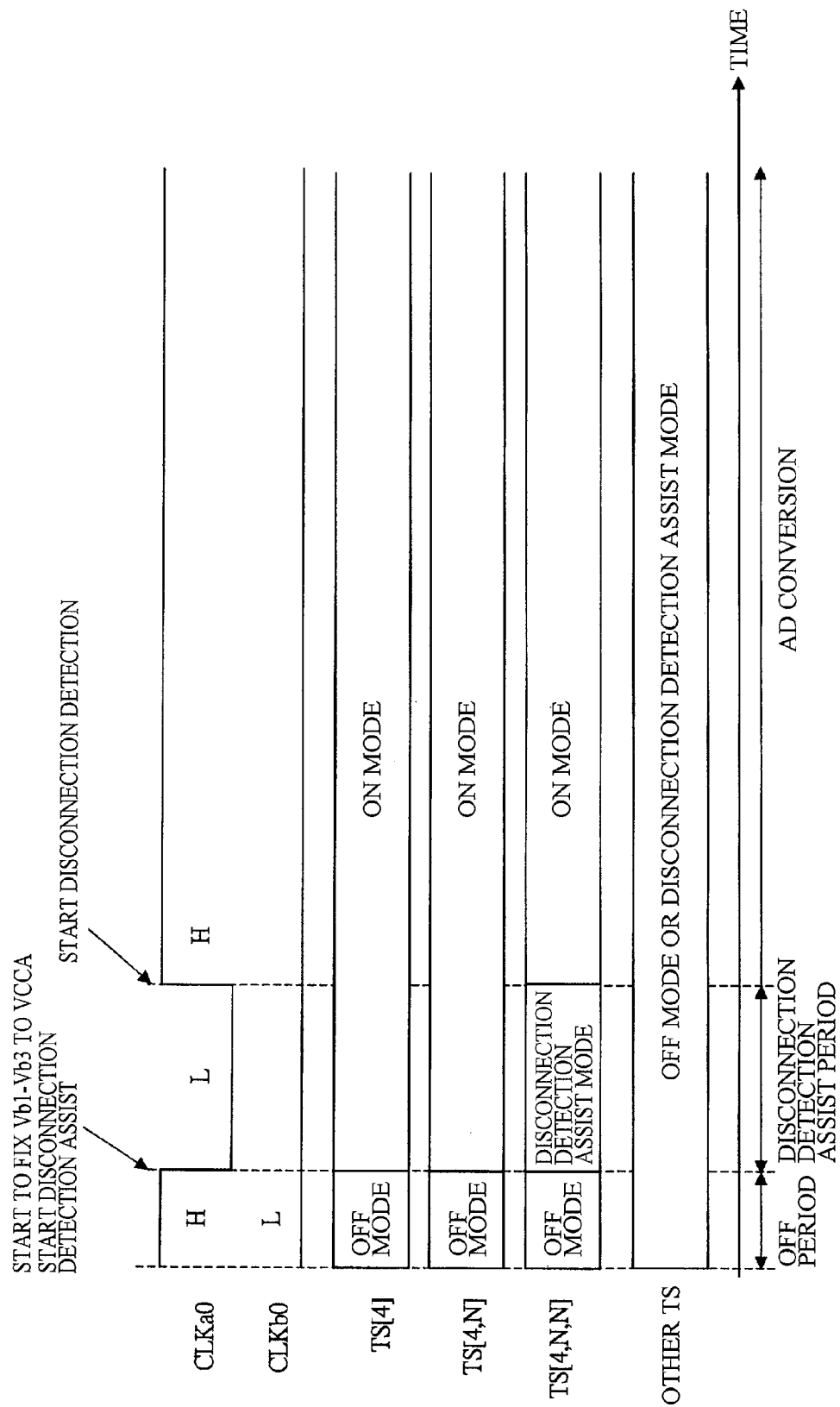
FIG. 15 is a sequence diagram showing an operation during disconnection detection in the analog/digital conversion circuit block in FIG. 14.

FIG. 15 is a sequence diagram showing an operation during disconnection detection in the analog/digital conversion circuit block in FIG. 14. A disconnection is in an external wiring connecting to the input port [4, N, N] in FIG. 14 and this disconnection is detected. In FIG. 15, the disconnection detection assist period is provided before the start of disconnection detection, as in FIG. 13. During the disconnection detection assist period, to charge to VCCA the path from one end of TS[4, N, N] to Ain, TS[4, N] and TS[4] are turned on and also CLKa0 is set to the 'L' level, and thus all MPus in PUPD1 to PUPD3 are turned on. In this case, TS[4, N, N] is in the disconnection detection assist mode as shown in FIG. 4B, and the other switch circuits can be set to the off mode, or can be set to the disconnection detection assist mode depending on circumstances. After this disconnection detection assist period, MPus in PUPD1-PUPD3 are turned off again, and as in FIG. 13, TS[4, N, N] is caused to transition from the disconnection detection assist mode to the on mode, and thus the disconnection detection is started.

Figure 16:
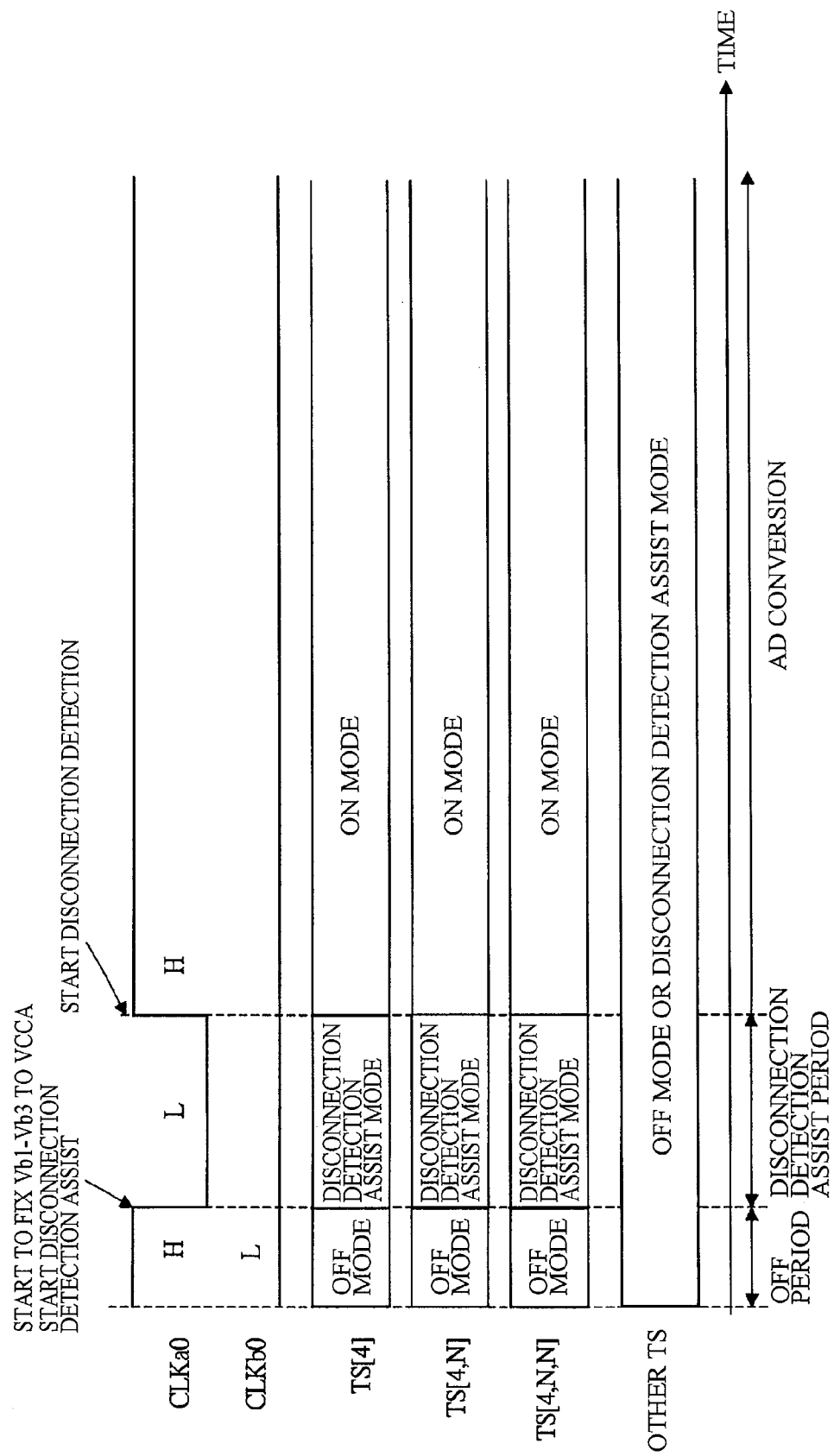
FIG. 16 is a sequence diagram showing an operation different from FIG. 15 during disconnection detection.

FIG. 16 is a sequence diagram showing an operation different from FIG. 15 during disconnection detection. In FIG. 15, in the disconnection detection assist period, the T-type switch circuits TS[4] and TS[4, N] are controlled to the on mode, while in FIG. 16, TS[4] and TS[4, N] are controlled to the disconnection detection assist mode together with TS[4, N, N], and subsequently, the TS[4], TS[4, N] and TS[4, N, N] are all controlled to the on mode in starting disconnection detection. In the configuration in FIG. 14, unlike the configuration in FIG. 12, PUPD1 to PUPD3 are provided in each path between the switch circuits, and thus even if each switch circuit is controlled to the disconnection detection assist mode in the disconnection detection assist period, each path can be charged to VCCA without forming any node other than VCCA in TS[4] and TS[4, N].

As described above, by using the semiconductor integrated circuit device of Embodiment 5, the same effect as Embodiment 4 can be obtained, and additionally, as with Embodiment 3 (FIG. 9, FIG. 10), a reduction of the period required for disconnection detection or a further speeding-up of the analog/digital conversion circuit block can be achieved. Moreover, by using the operation in FIG. 16, the control in disconnection detection can be simplified as with the Embodiment 3 (FIG. 11).

Embodiment 6

Configuration and Operation [1] of a T-Type Switch Circuit with an Equalizer

Figure 17:
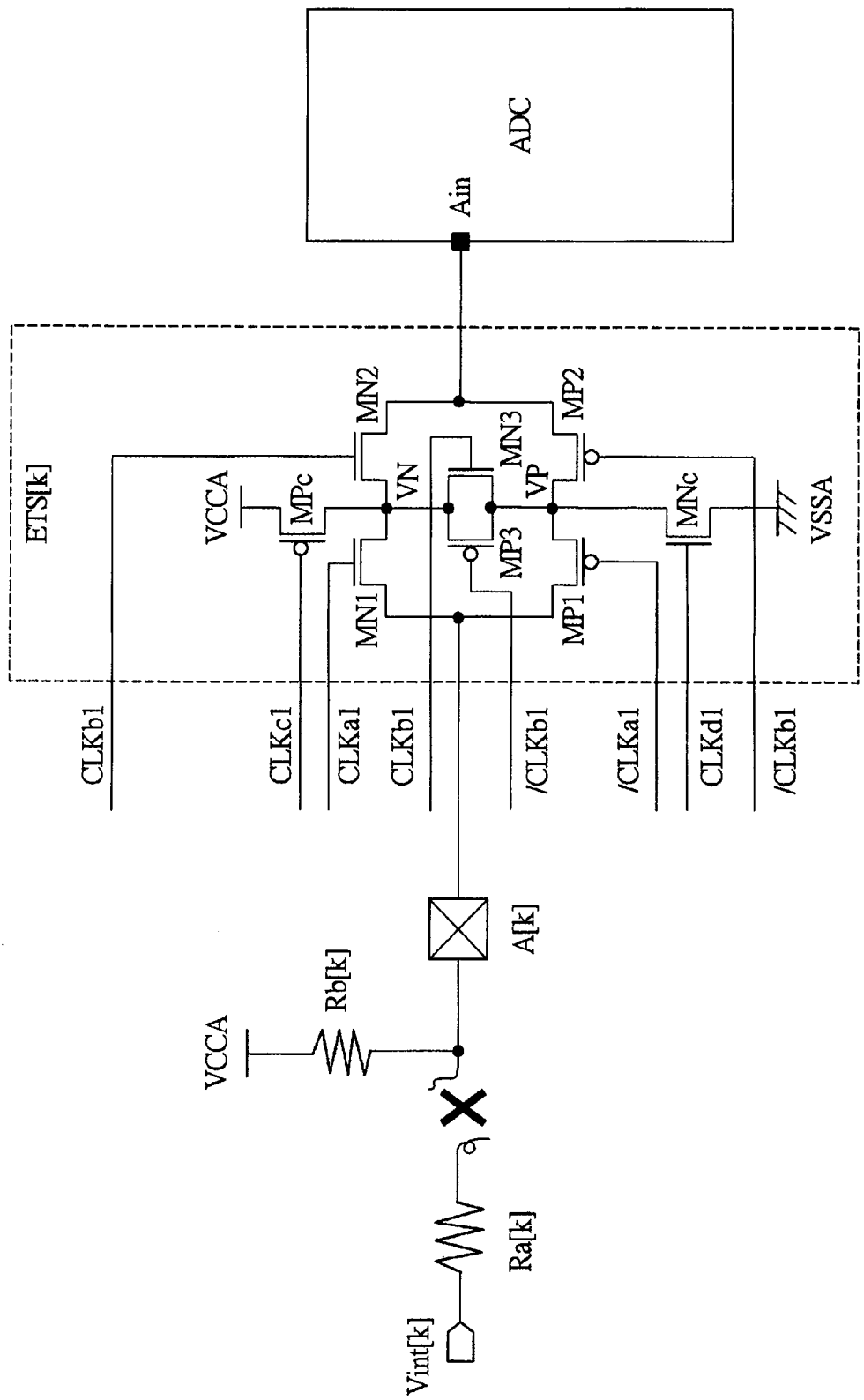
FIG. 17 is a circuit diagram showing a configuration around each switch circuit in an analog/digital conversion circuit block in a semiconductor integrated circuit device in accordance with Embodiment 6 of the present invention.

FIG. 17 is a circuit diagram showing a configuration around each switch circuit in an analog/digital conversion circuit block in a semiconductor integrated circuit device in accordance with Embodiment 6 of the present invention. FIG. 17 shows a T-type switch circuit with an equalizer ETS[k], which includes the PMOS transistors MP1 to MP3, the NMOS transistors MN1 to MN3, and MNc as with the T-type switch circuit with an equalizer ETS' shown in FIG. 29C. However, ETS[k] in FIG. 17 differs from ETS' of FIG. 29C in the on/off control signals of each transistor. In the configuration in FIG. 17, four clock signals CLKa1, CLKb1, CLKc1, and CLKd1 (and inverted clock signals /CLKa1, /CLKb1) of CLKa1 and CLKb1) are supplied to ETS[k]. CLKa1 is supplied to the gate of MN1 and /CLKa1 is supplied to the gate of MP1. CLKb1 is supplied to the gates of MN2 and MN3, and /CLKb1 is supplied to the gates of MP2 and MP3. CLKc1 is supplied to the gate of MPc and CLKd1 is supplied to the gate of MNc.

Figure 18B:
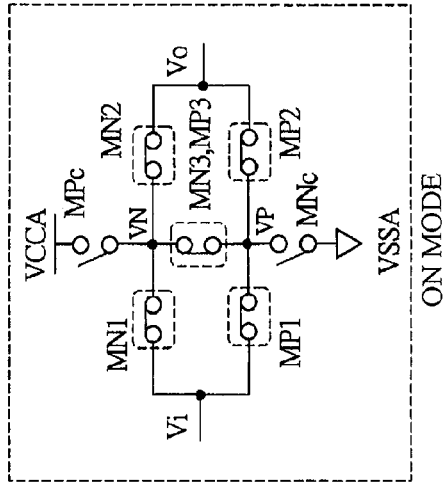
FIGS. 18A to 18D are schematic views showing different operation modes when a T-type switch circuit with an equalizer in FIG. 17 is used.
Figure 18D:
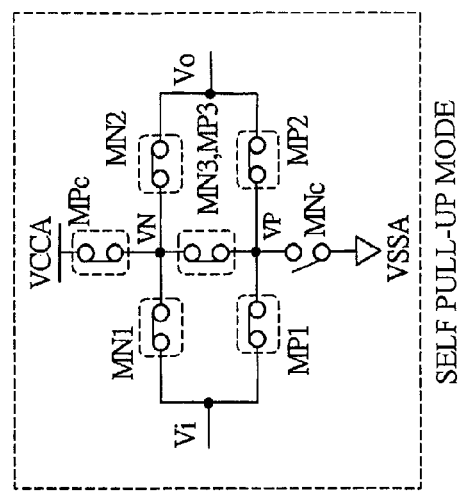
Figure 18A:
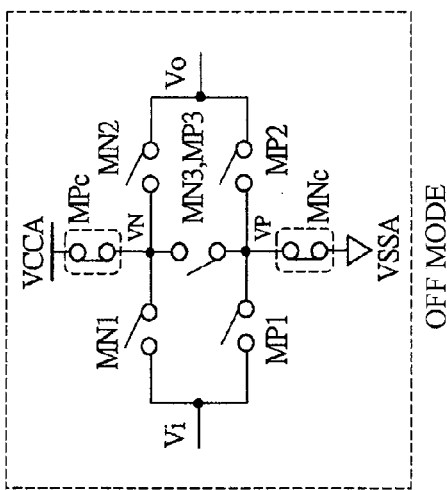

If the T-type switch circuit with an equalizer ETS[k] as shown in FIG. 17 is used, the operation modes as shown in FIGS. 18A to 18D can be realized by properly controlling each clock signal. FIGS. 18A to 18D are schematic views each showing a different operation mode when the T-type switch circuit with an equalizer in FIG. 17 is used. FIG. 18A shows the off mode. MN1 to MN3 and MP1 to MP3 are turned off and MPc and MNc are turned on, as with ETS' in FIG. 29C. Both CLKa1 and CLKb1 are at an 'L' level, CLKc1 is at an 'L' level, and CLKd1 is at an 'H' level. In the off mode, the voltage VN of the common connection node of MN1 and MN2 is pre-charged to VCCA, and the voltage VP of the common connection node of MP and MP2 is pre-charged to VSSA.

FIG. 18B shows the on mode. MN1 to MN3 and MP1 to MP3 are turned on, and MPc and MNc are turned off, as with ETS' in FIG. 29C. Both CLKa1 and CLKb1 are at an 'H' level, CLKc1 is at an 'H' level, and CLKd1 is at an 'L' level. In the on mode, the common connection node of MN1 and MN2 and the common connection node of MP and MP2 are connected to each other by the equalizing switches (MP3 and MN3), and thus, as described in FIG. 29C, the conversion error of the analog/digital conversion circuit ADC can be reduced.

Figure 18C:
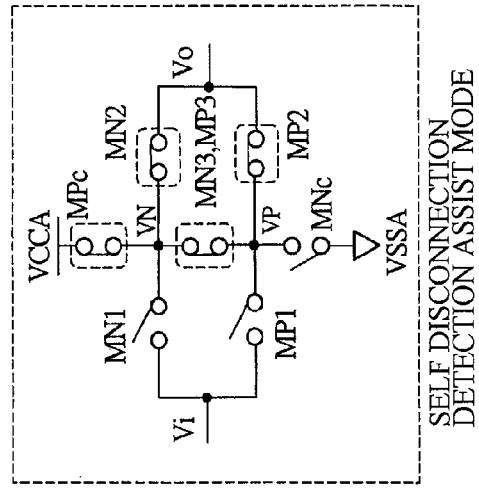

FIG. 18C shows a self disconnection detection assist mode, which cannot be realized in FIG. 29C. In the self disconnection detection assist mode, the MN1, MP1 and MNc are turned off and the MN2, MP2, MN3, MP3, and MPc are turned on. CLKa1 is at an 'L' level, CLKb1 is at an 'H' level, CLKc1 is at an 'L' level, and CLKd1 is at an 'L' level. FIG. 18D shows a self pull-up mode, which cannot be realized in FIG. 29C. In the self pull-up mode, MNc is turned off and MN1 to MN3, MP1 to MP3, and MPc are turned on. CLKa1 and CLKb1 are at an 'H' level, CLKc1 is at an 'L' level, and CLKd1 is at an 'L' level.

Figure 19:
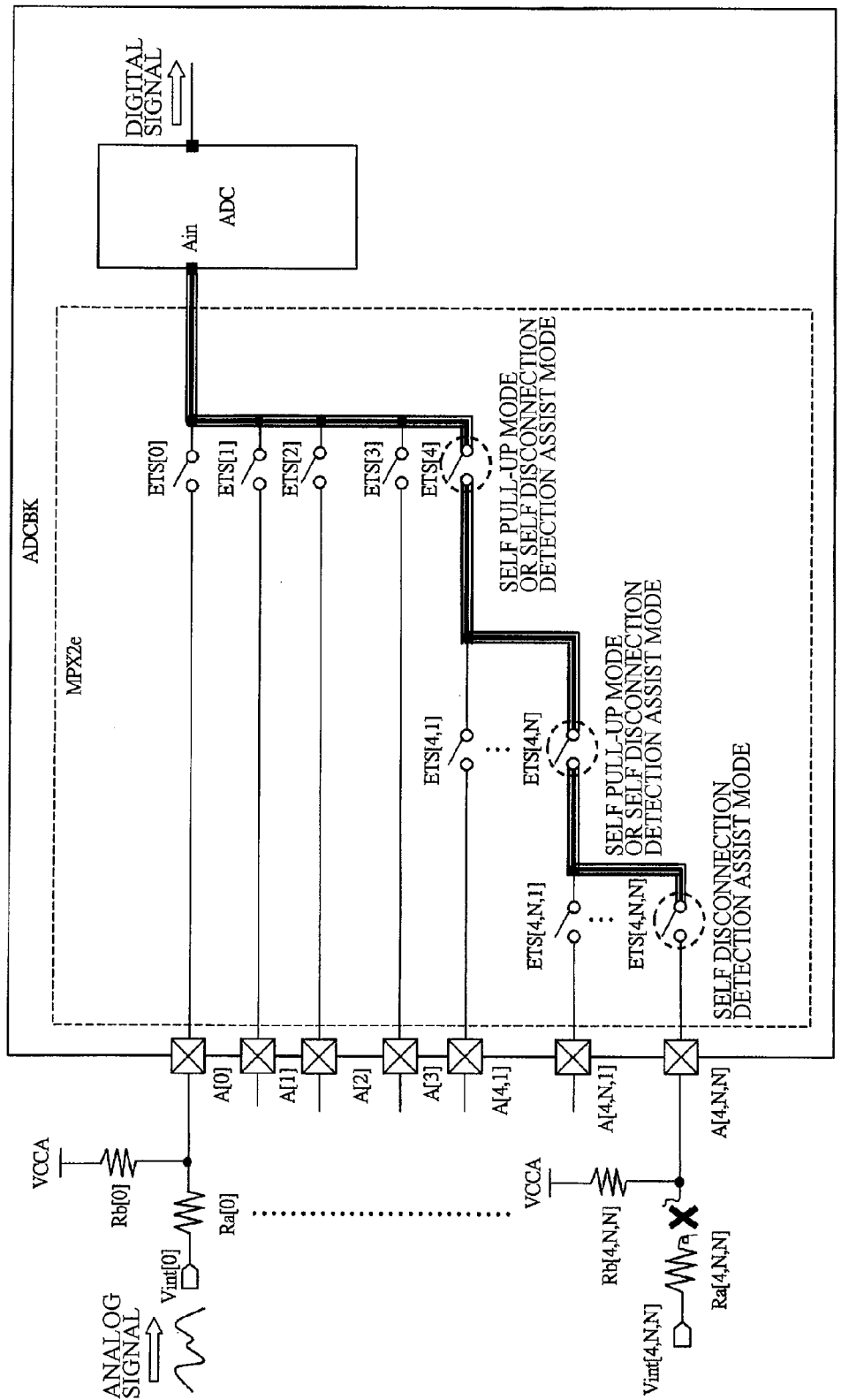
FIG. 19 is a circuit diagram showing a detailed configuration around the multiplexer circuit in the analog/digital conversion circuit block in FIG. 6, in the semiconductor integrated circuit device in accordance with Embodiment 6 of the present invention.

Configuration and Operation [2e] of the Major Portion of an Analog/Digital Conversion Circuit Block FIG. 19 is a circuit diagram showing a detailed configuration around the multiplexer circuit in the analog/digital conversion circuit block in FIG. 6, in a semiconductor integrated circuit device in accordance with Embodiment 6 of the present invention. In a multiplexer circuit MPX2e shown in FIG. 19, SW[0]-SW[4], SW[4, 1]-SW[4, N], and SW[4, N, 1]-SW[4, N, N] in MPX2 in FIG. 6 include the T-type switch circuits with an equalizer ETS[0]-ETS[4], ETS[4, 1]-ETS[4, N], and ETS[4N, 1]-ETS[4, N, N] as shown in FIG. 17, respectively. Moreover, the multiplexer circuit MPX2e includes no pull-up/pull-down circuit as described in each embodiment described above.

Figure 20:
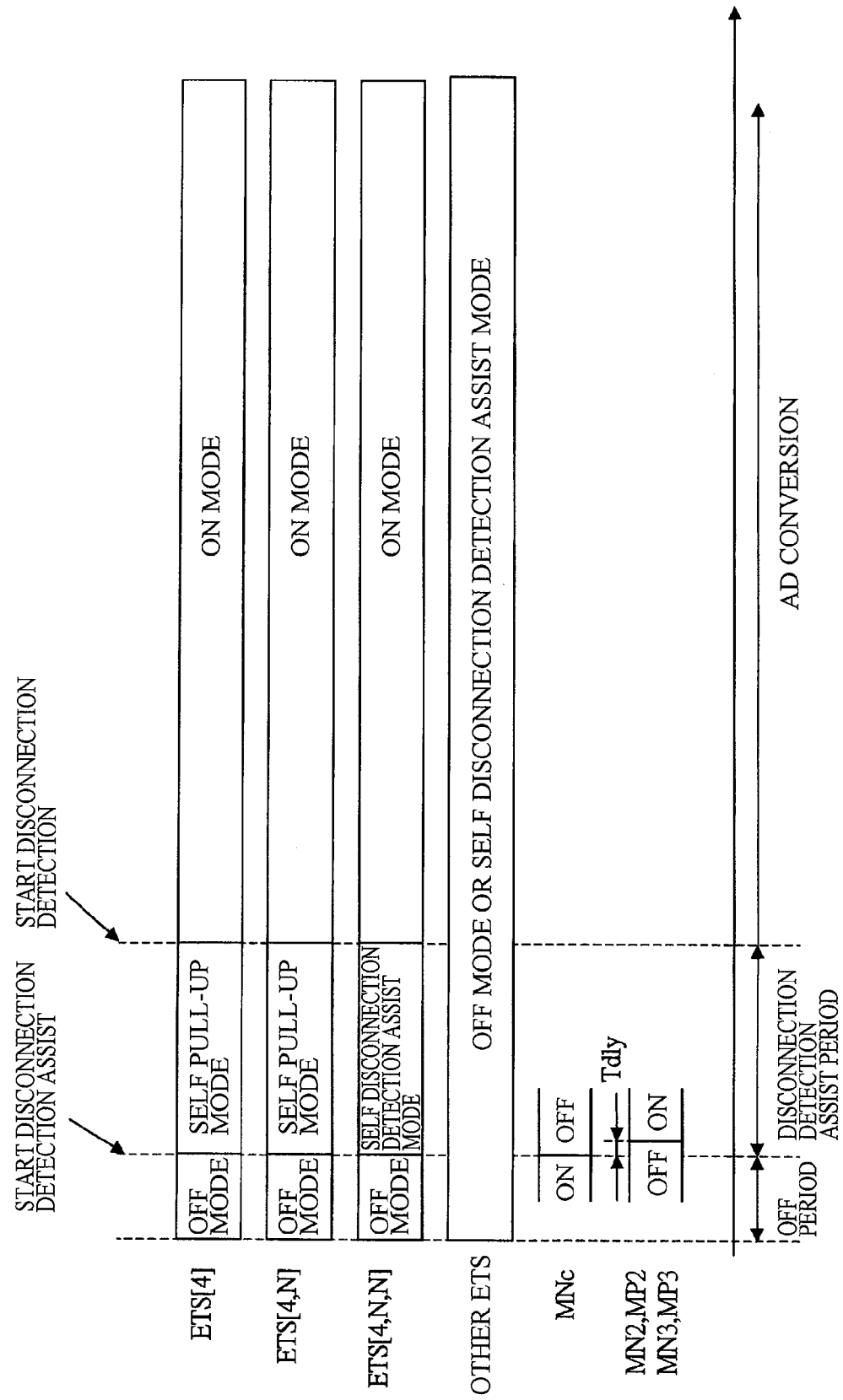
FIG. 20 is a sequence diagram showing an operation during disconnection detection in the analog/digital conversion circuit block in FIG. 19.

FIG. 20 is a sequence diagram showing an operation during disconnection detection in the analog/digital conversion circuit block in FIG. 19. A disconnection is in an external wiring connecting to the input port [4, N, N] in FIG. 19 and this disconnection is detected. In FIG. 19, the disconnection detection assist period is provided before the start of disconnection detection, as with each embodiment described above. During the disconnection detection assist period, to charge to VCCA the path from one end of ETS[4, N, N] to Ain, ETS[4, N] and ETS[4] are set to the self pull-up mode shown in FIG. 18D. ETS[4, N, N] is set to the self disconnection detection assist mode shown in FIG. 18C, and the other T-type switch circuits with an equalizers are set to the off mode shown in FIG. 18A, or set to the self disconnection detection assist mode depending on circumstances.

Moreover, as shown in FIG. 20, each T-type switch circuit with an equalizer transitions from an off period to the disconnection detection assist period. In the off period, ETS[4, N, N], ETS[4, N], and ETS[4] are set to the off mode as shown in FIG. 18A, and thus at the moment when the ETS[4, N, N], ETS[4, N], and ETS[4] transition from the off mode to the disconnection detection assist period, a shoot-through current from VCCA toward VSSA may be generated. Then, as described also in FIG. 5, it is preferable to control to turn off MNc and subsequently, after a delay time Tdly, turn on MN2, MP2, MN3, and MP3. After this disconnection detection assist period, ETS[4, N, N], ETS[4, N], and ETS[4] are set to the on mode shown in FIG. 18B and whereby the disconnection detection is started.

If the configuration (operation in FIG. 20) in FIG. 19 is used, as compared with the case where the T-type switch circuits in accordance with Embodiment 4 and Embodiment 5 described above are used, an improvement in the conversion accuracy of ADC associated with the addition of the equalizing switch, a reduction in the circuit area associated with the elimination of the pull-up/pull-down circuit, and the like can be achieved. When the disconnection detection assist mode using the T-type switch circuit as shown in FIG. 4B is used, even if MPc is turned on, the voltage (Vo) of the common connection node of MN2 and MP2 or the voltage VP of the common connection node of MP and MP2 becomes a value dropped from VCCA by the threshold voltage of MN2. Therefore, the above-mentioned pull-up/pull-down circuit is required. In contrast, when the self disconnection detection assist mode or the self pull-up mode by the T-type switch circuit with an equalizer as shown in FIGS. 18C and 18D is used, the voltage VP can beset to VCCA because the equalizing switches (MN3 and MP3) including a CMOS switch circuit is provided. This can eliminate the pull-up/pull-down circuits.

Moreover, the configuration (the operation in FIG. 20) in FIG. 19 can substantially realize the same state as the state where a plurality of pull-up/pull-down circuits as shown in FIG. 9 is provided. Therefore, as in FIG. 9, reducing the period required for disconnection detection or a further speeding up the analog/digital conversion circuit block can be achieved. Furthermore, the configuration in FIG. 19 can further reduce the load capacitance on each path and can contribute to a further speeding-up because it can eliminate the pull-up/pull-down circuit.

Figure 21:
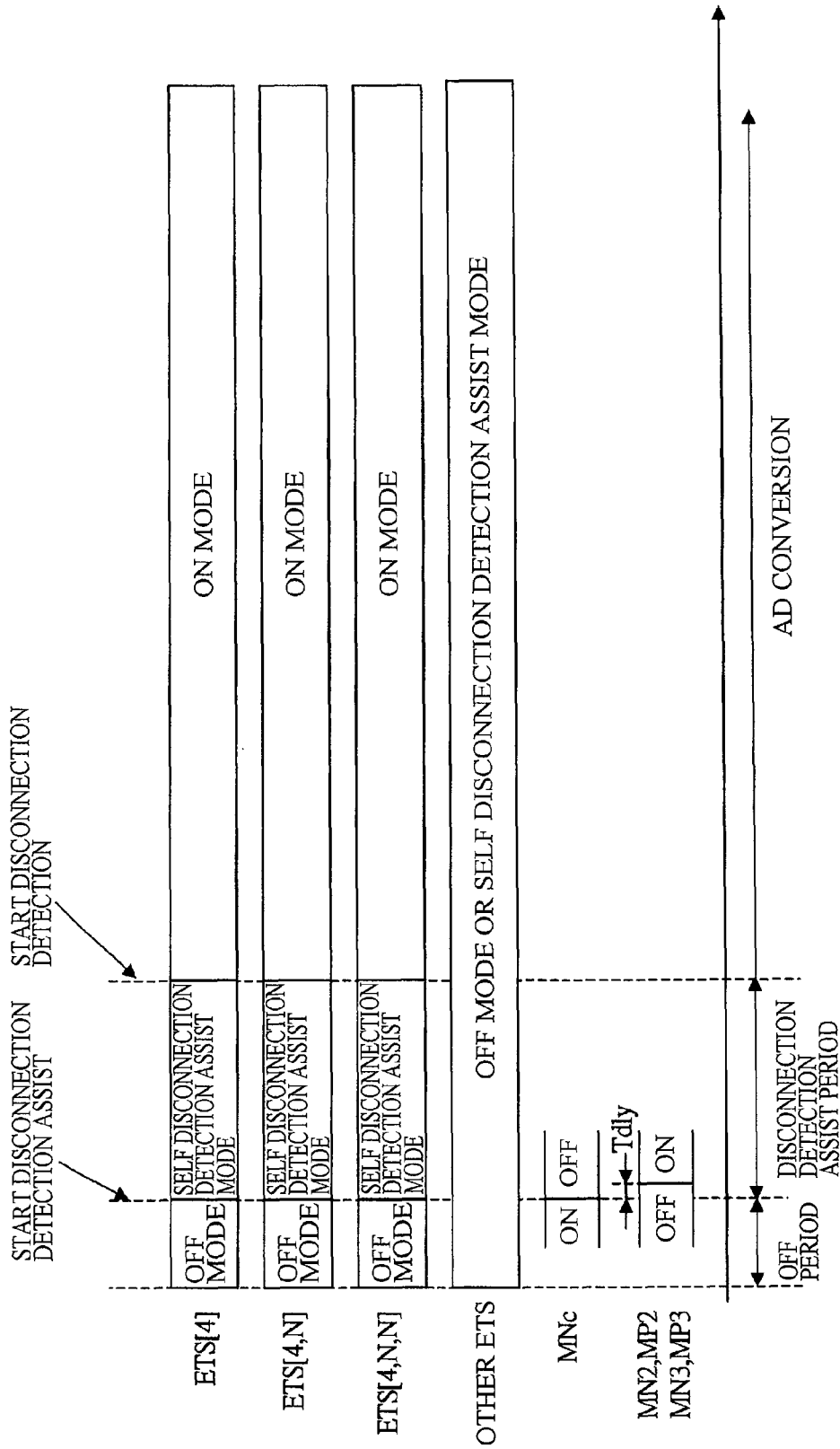
FIG. 21 is a sequence diagram showing an operation during disconnection detection different from the operation in FIG. 20.

FIG. 21 is a sequence diagram showing an operation different from FIG. 20 during disconnection detection. In FIG. 20, in the disconnection detection assist period, the T-type switch circuits with an equalizer ETS[4], ETS[4, N] are controlled to the self pull-up mode, while in FIG. 21, ETS [4] and ETS [4, N] are controlled to the self disconnection detection assist mode together with ETS[4, N, N]. Subsequently, ETS [4], ETS[4, N] and ETS[4, N, N] are all turned on in starting disconnection detection. In the configuration in FIG. 19, each path sandwiched by the T-type switch circuits with an equalizer can be pulled up by this circuit. Therefore, as in FIG. 16, even if the self disconnection detection assist mode is used in the disconnection detection assist period, each path can be charged to VCCA without forming any node other than VCCA in ETS[4] and ETS[4, N]. Thus, the control of each T-type switch circuit with an equalizer can be simplified as compared with the operation in FIG. 20.

As described above, by using the semiconductor integrated circuit device in accordance with Embodiment 6, the same effect as Embodiment 5 can be obtained, and additionally an improvement in the conversion accuracy of ADC by providing the equalizing switch, reducing the circuit area or a further speeding up associated with the elimination of the pull-up/pull-down circuit, and the like can be achieved.

Embodiment 7

Configuration and Operation [2] of a T-Type Switch Circuit with an Equalizer

Figure 22:
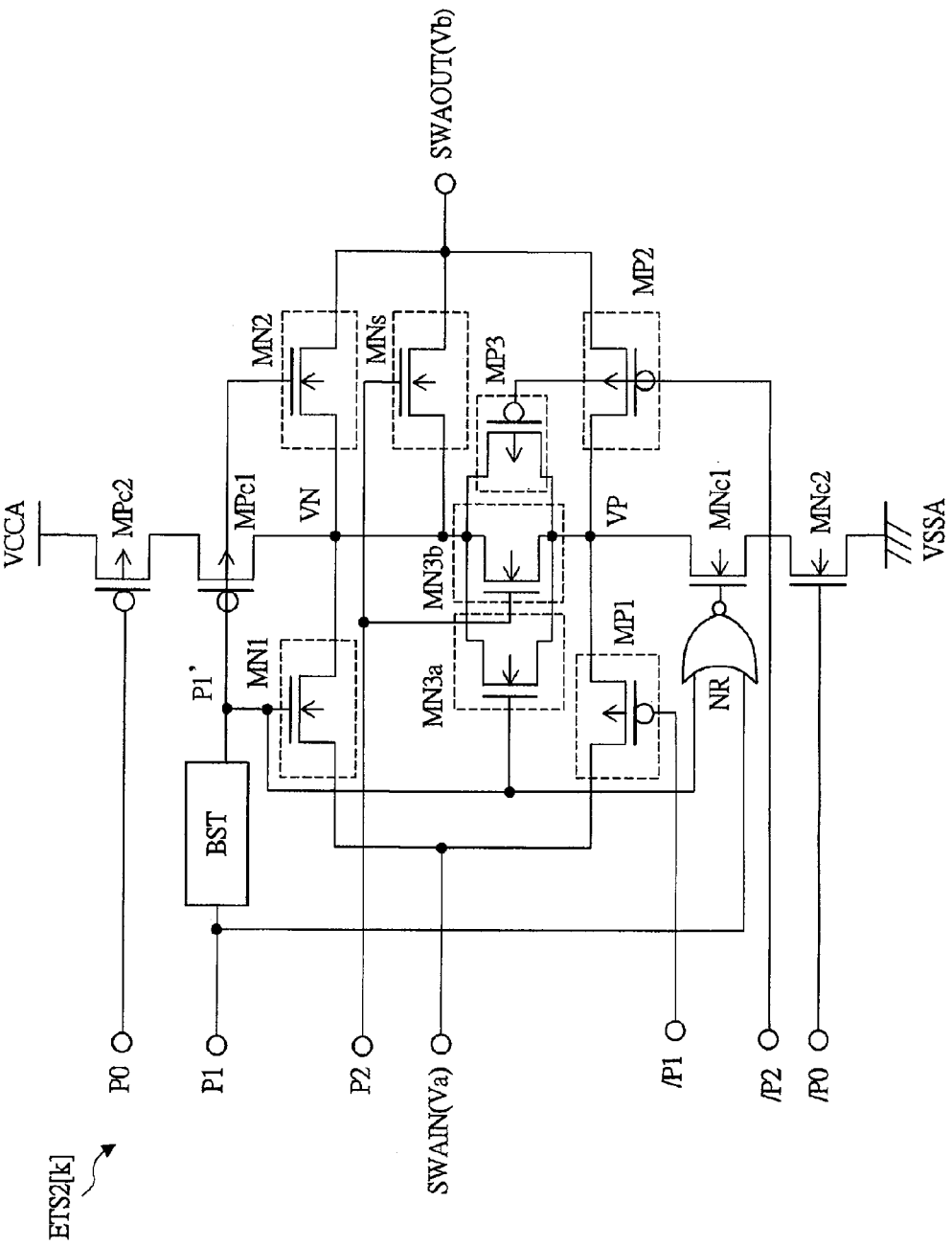
FIG. 22 is a circuit diagram showing a configuration of each switch circuit in an analog/digital conversion circuit block in a semiconductor integrated circuit device in accordance with Embodiment 7 of the present invention.

FIG. 22 is a circuit diagram showing a configuration of each switch circuit in an analog/digital conversion circuit block in a semiconductor integrated circuit device in accordance with Embodiment 7 of the present invention. The switch circuit shown in FIG. 22 is a T-type switch circuit with an equalizer ETS2[k]. Instead of providing the self disconnection detection assist mode or the self pull-up mode as shown in FIGS. 18C and 18D, the same disconnection detection assist mode as FIG. 4B is provided assuming the use of the pull-up/pull-down circuit described above. The equalizing switch is provided to reduce the A/D conversion error. Furthermore, a booster circuit for turning on an NMOS transistor for switching is provided. If the booster circuit is used, the on-resistance of the NMOS transistor for switching can be reduced, and reducing the A/D conversion error, reducing the sampling time of the A/D conversion (speeding up the analog/digital conversion circuit block), and the like can be achieved.

ETS2[k] in FIG. 22 includes NMOS transistors MN1, MN2, MN3$a$, MN3$b$, MNs, MNc1, and MNc2, PMOS transistors MP1 to MP3, MPc1 and MPc2, a booster circuit BST, and a NOR circuit NR. MN1 and MN2 are connected with their source/drain paths connected in series between an input node SWAIN and an output node SWAOUT, and MP1 and MP2 are also connected with their source/drain paths connected in series between SWAIN and SWAOUT. MN3$a$, MN3$b$, and MP3 are connected with their source/drain paths connected in parallel between the common connection node of MN1 and MN2 and the common connection node of MP and MP2. MNs is connected with its source/drain path connected between the common connection node of MN1 and MN2 and SWAOUT. MPc1 and MPc2 are connected, in this order, with their source/drain paths connected in series from the common connection node of MN1 and MN2 toward VCCA, while MNc1 and MNc2 are connected, in this order, with their source/drain paths connected in series from the common connection node of MP and MP2 toward VSSA.

Although not limited in particular, the MN1, MN2, MN3$a$, MN3$b$, MNs, and MP1 to MP3 have threshold voltages lower than those of MPc1, MPc2, MNc1, and MNc2 to reduce their on-resistances. Moreover, three clock signals P0, P1, and P2 (and their inverted clock signals (/P0, /P1, /P2)) are supplied to the ETS2[k]. The booster circuit BST boosts up P1 to generate a boosted clock signal P1'. The NOR circuit performs a NOR operation with P1 and P1' as inputs, and drives the gate of MNc1 with this operation result. P0 drives the gate of MPc2 and /P0 drives the gate of MNc2. P1' drives the gates of MN1, MN2, MN3$a$, and MPc1 and /P1 drives the gate of MP1. P2 drives the gates of MN3$b$ and MNs, and /P2 drives the gates of MP2 and MP3.

Figure 23:
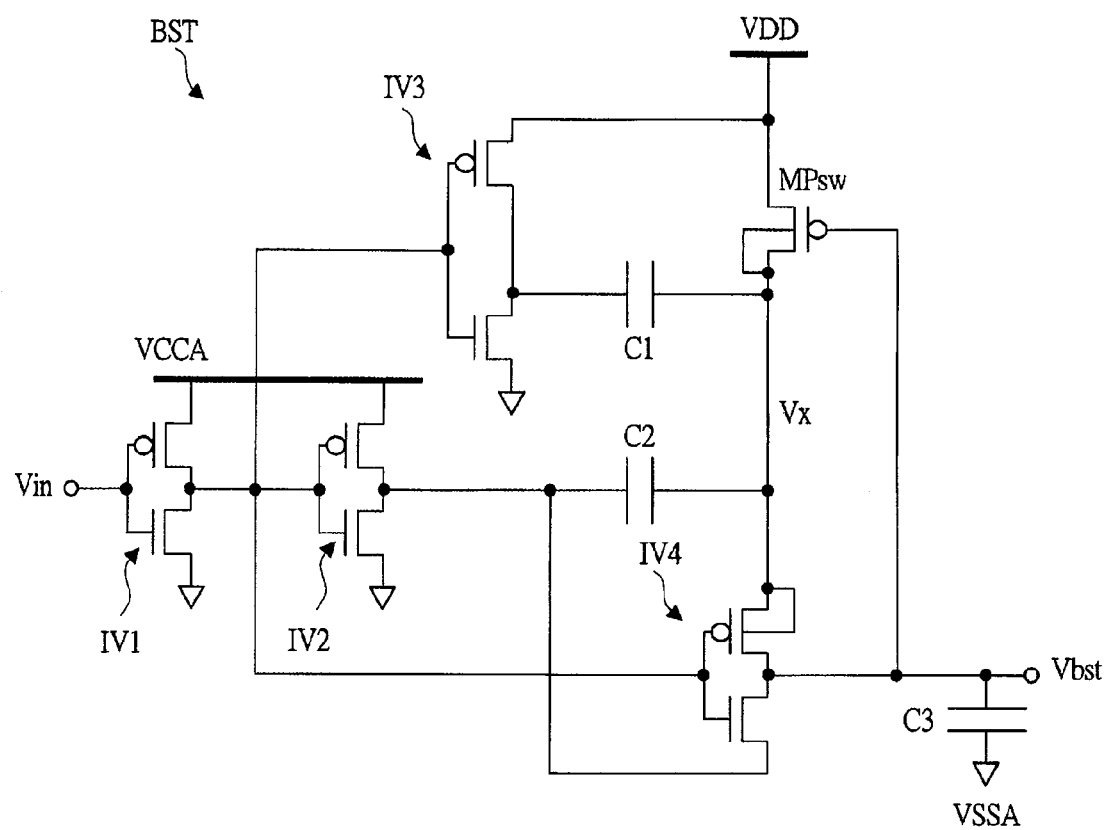
FIG. 23 is a circuit diagram showing a configuration of a booster circuit in a T-type switch circuit with an equalizer in FIG. 22.

FIG. 23 is a circuit diagram showing a configuration of the booster circuit in the T-type switch circuit with an equalizer in FIG. 22. The booster circuit BST in FIG. 23 includes CMOS inverter circuits IV1 to IV4, capacitors C1 to C3, and a PMOS transistor MPsw. In FIG. 23, when an input voltage Vin is at an 'L' level, IV1 outputs the voltage level of VCCA, IV2 and IV3 output the voltage level of VSSA, and IV4 outputs the voltage level of VSSA. Thus, MPsw is turned on and the charge at the VDD level is held in C1 and C2. Subsequently, when Vin transitions to an 'H' level, IV1 outputs the voltage level of VSSA, IV2 outputs the voltage level of VCCA, IV3 outputs the voltage level of VDD, and the PMOS transistor in IV4 is turned on. Thus, MPsw is turned off, and VDD and VCCA are applied to one end of C1 and C2, respectively, and also the charges at VDD level held in C1 and C2 are redistributed to C1, C2 and C3 via a node Vx. As a result, a boost voltage Vbst generated in C3 is given by Formula (1). As can be seen from Formula (1), the Vbst obtained by boosting VCCA can be obtained by properly controlling a capacitor ratio of C1 to C3 and adding VDD and VCCA with an adequate ratio.

$$\text{Vbst}=\{(2-C1+C2)\cdot\text{VDD}+C2\cdot\text{VCCA}\}/(C1+C2+C3) \quad (1)$$

Figure 24:
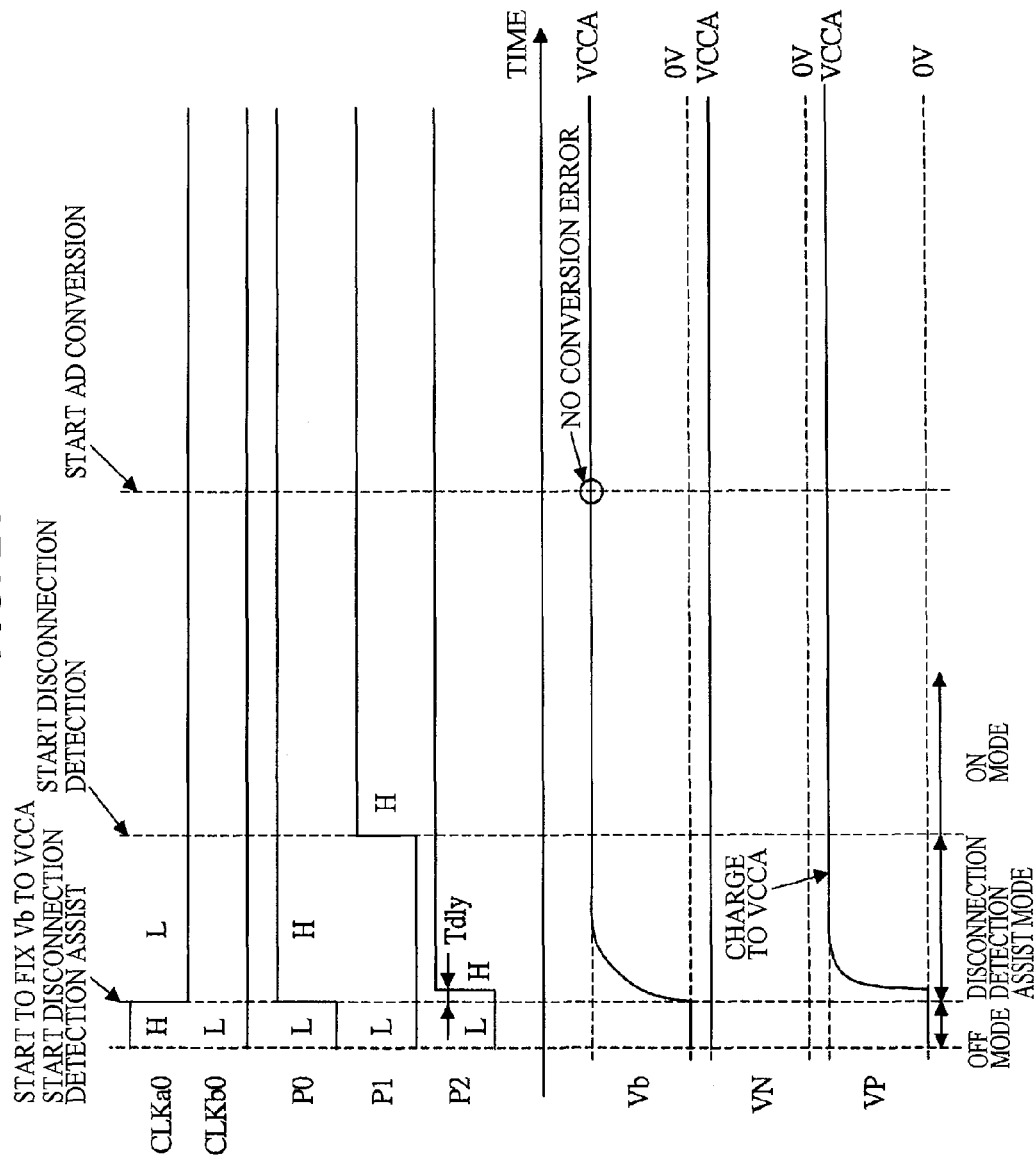
FIG. 24 is a waveform chart showing an operation during disconnection detection using the T-type switch circuit with an equalizer in FIG. 22.
Figure 25:
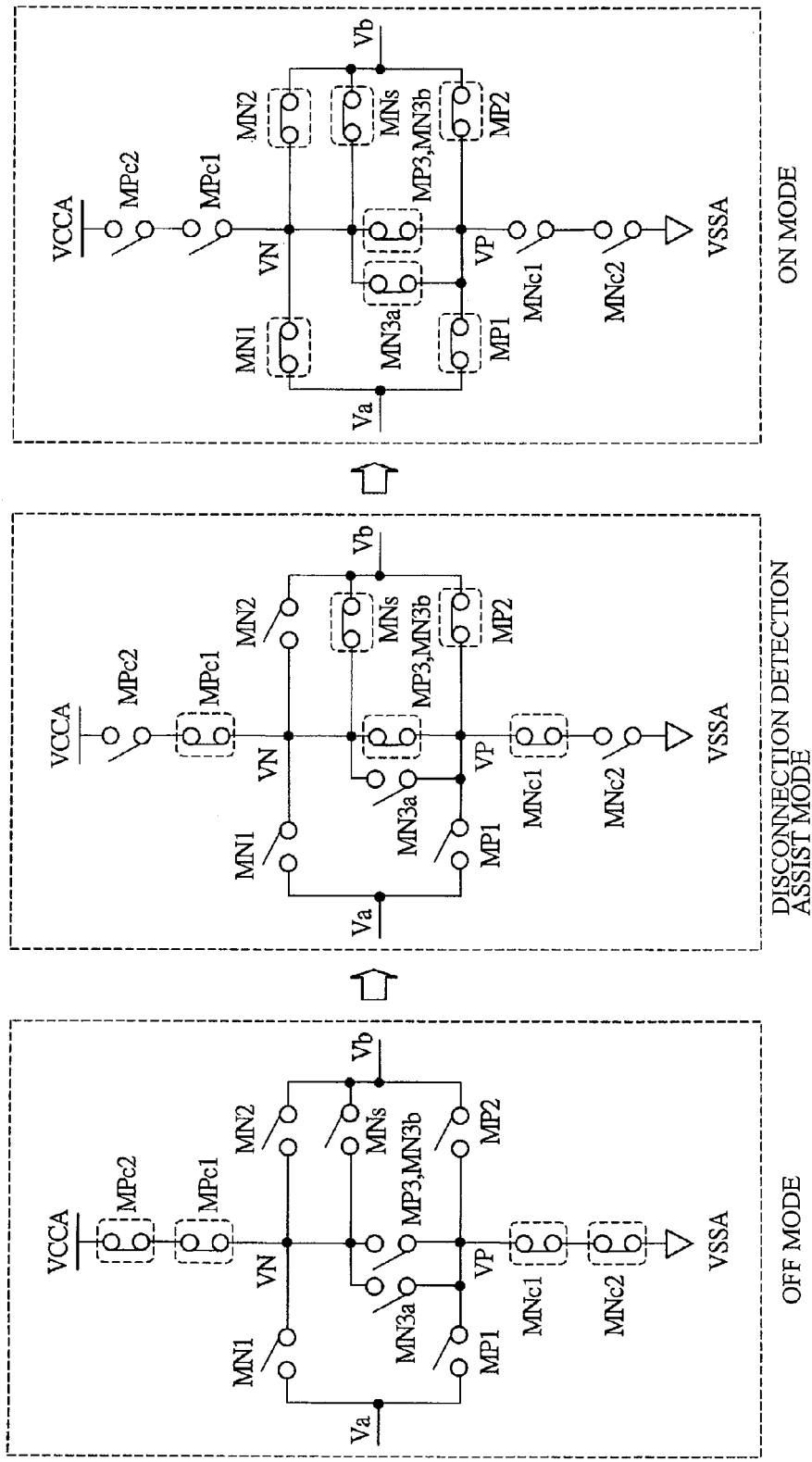
FIG. 25 is a supplementary view of FIG. 24.

FIG. 24 is a waveform chart showing an operation example during disconnection detection using the T-type switch circuit with an equalizer in FIG. 22. FIG. 25 is a supplementary view of FIG. 24. The description will be made by assuming the case where the T-type switch circuit with an equalizer ETS2[k] of FIG. 22 is applied instead of the T-type switch circuit TS[k] in FIG. 3. As shown in FIG. 24, during disconnection detection, as in FIG. 5, ETS2[k] is caused to transition from the off mode to the disconnection detection assist mode and to the on mode in this order. In the off mode, as shown in FIG. 25, MPc1, MPc2, MNc1, and MNc2 are turned on, the rest is turned off, the voltage VN of the common connection node of MN1 and MN2 is pre-charged to VCCA, and the voltage VP of the common connection node of MP and MP2 is pre-charged to VSSA.

Next, by transition to the disconnection detection assist mode, as shown in FIG. 25, the MPc1, MNc1, MP2, MP3, MN3$b$, and MNs are turned on and the rest is turned off. Because the voltage Vb of the common connection node of MN2 and MP2 is set to VCCA via the pull-up/pull-down circuit, both the voltages VN and VP are set to VCCA. Moreover, in transitioning from the off mode to the disconnection detection assist mode, as shown in FIG. 24, it is preferable to cause P2 to change after the delay time Tdly after PO has changed. Thus, the shoot-through current from VCCA toward VSSA can be prevented as described in FIG. 5. Next, by transition to the on mode, as shown in FIG. 25, the MN1, MN2, MN3$a$, MN3$b$, MNs, and MP1 to MP3 are turned on, and the rest is turned off. MN1, MN2 and MN3a are set to have a low on-resistance, because these are turned on by the booster circuit BST.

In FIG. 22, the reason why the transistors between the common connection node of MN1 and MN2 and VCCA and those between the common connection node of MP and MP2 and VSSA are configured in two stages (MPc1, MPc2 and MNc1, MNc2), respectively, is to reduce a leakage current from the common connection node toward VCCA and VSSA, respectively, in the on mode. The threshold voltages of MPc1, MPc2, MNc1, and MNc2 are set relatively higher. Moreover, the reason why the NOR circuit is provided is for synchronizing the timing to turn on MNc1 with the timing of P1' from the booster circuit BST and also synchronizing the timing to turn off MNc1 with the timing of P1.

Furthermore, in FIG. 22, the reason why MNs is provided is to set the number of booster circuits BST to one. In the disconnection detection assist mode, MN1 and MN2 need to be separately controlled, and thus it is usually necessary to provide two booster circuits. However, as shown in FIG. 23, because the circuit area of the booster circuit is relatively large, one booster circuit is more preferable. Then, MNs is provided instead of commonly controlling MN1 and MN2 using one booster circuit, and thus the same state (MN1 is off and MN2 is on) as FIG. 4B is equivalently realized.

Figure 26:
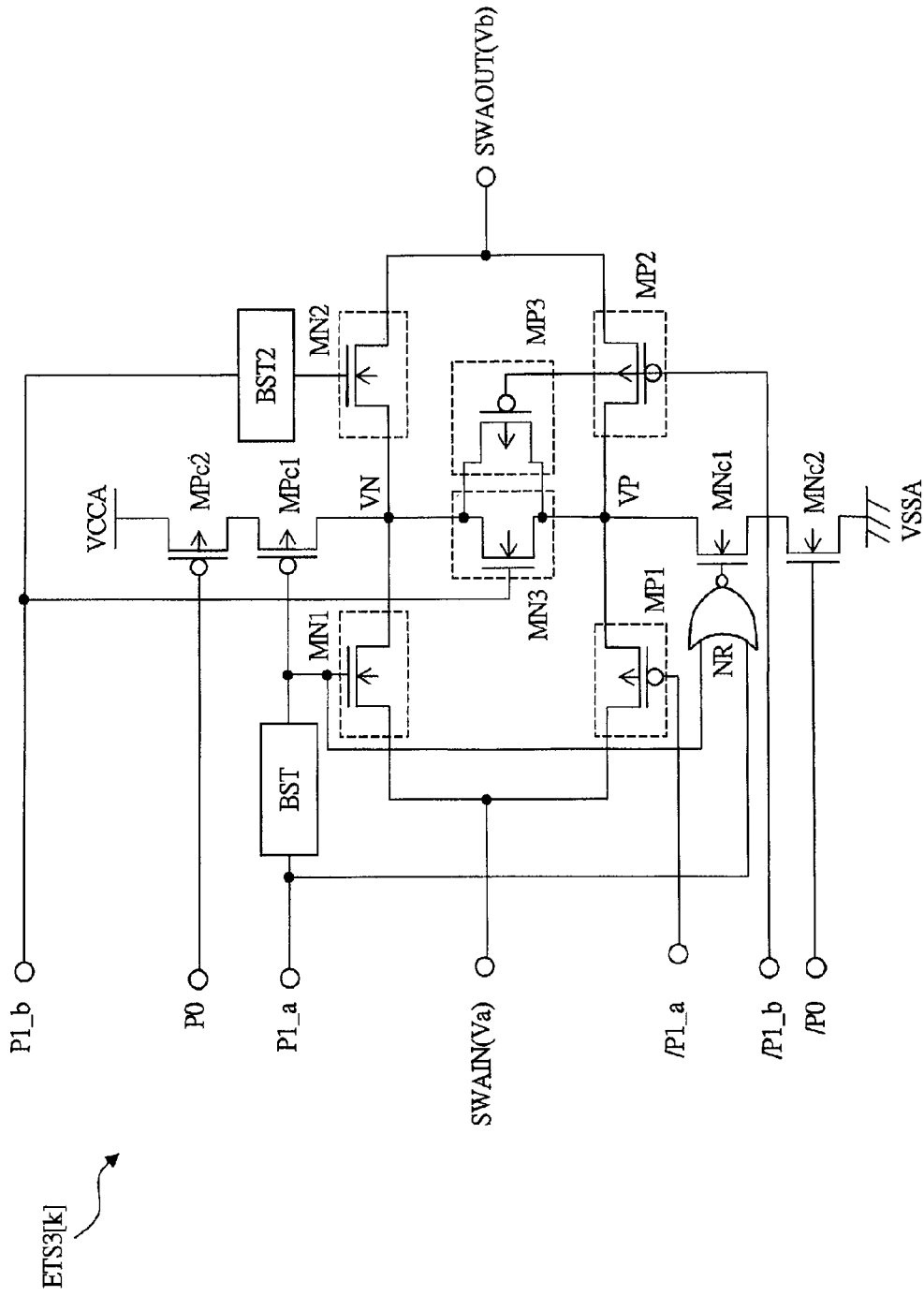
FIG. 26 is a circuit diagram showing a configuration of each switch circuit different from that in FIG. 22, in a semiconductor integrated circuit device in accordance with Embodiment 7 of the present invention.

FIG. 26 is a circuit diagram showing a configuration of each switch circuit different from FIG. 22, in a semiconductor integrated circuit device in accordance with Embodiment 7 of the present invention. In a T-type switch circuit with an equalizer ETS3[k] in FIG. 26, as compared with ETS2[k] of FIG. 22, MN3a and MNs are eliminated and instead a booster circuit BST2 is added. Accordingly, the output of the booster circuit BST which operates upon receipt of a clock signal P1_a is connected to the gates of MN1 and MPc1 and one end of the NOR circuit, while the output of a booster circuit BST2 which operates upon receipt of a clock signal P1_b is connected to the gate of MN2. Because the gates of MN1 and MN2 are separately controlled by these two booster circuits BST and BST2, the above-mentioned disconnection detection assist mode can be realized. However, the circuit area increases by the amount of the required two booster circuits.

As described above, by using the semiconductor integrated circuit device in accordance with Embodiment 7, the same effect as Embodiment 1 can be obtained, and additionally, an improvement in the A/D conversion accuracy by including the equalizing switch, or an improvement in the A/D conversion accuracy or an improvement in A/D conversion speed by including the booster circuit can be achieved. The disconnection detection assist mode is realized using the T-type switch circuit with an equalizer, but the self disconnection detection assist mode or the self pull-up mode as shown in FIGS. 18C and 18D can also be realized by suitably changing the control signal of each transistor.

Embodiment 8

Figure 27:
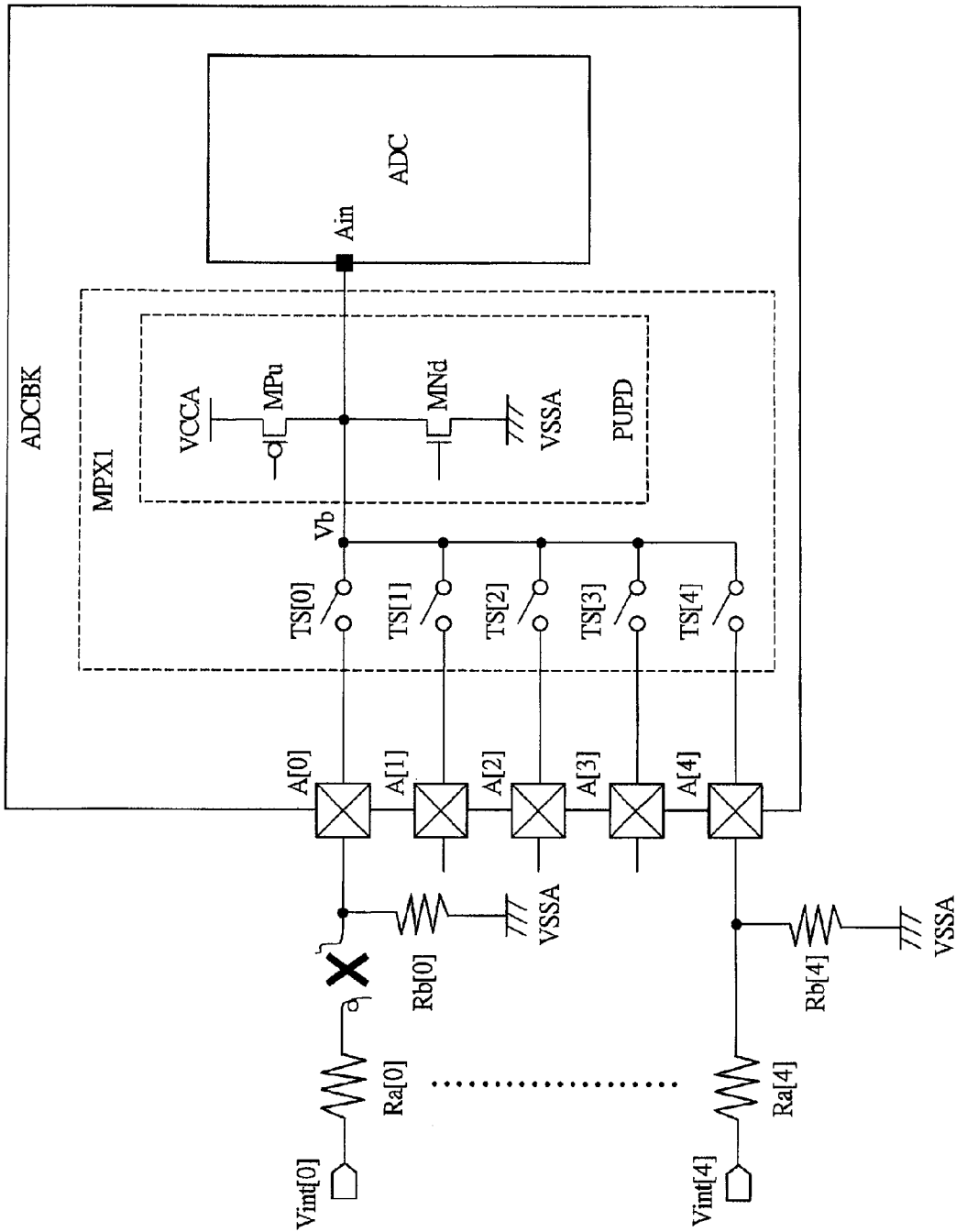
FIG. 27 is a schematic diagram showing a configuration of a major portion around an analog/digital conversion circuit block included in a semiconductor integrated circuit device in accordance with Embodiment 8 of the present invention.

Configuration and Operation [1'] of the Major Portion of an Analog/Digital Conversion Circuit Block FIG. 27 is a schematic diagram showing a configuration of a main part around an analog/digital conversion circuit block included in a semiconductor integrated circuit device in accordance with Embodiment 8 of the present invention. FIG. 27 shows the same analog/digital conversion circuit block ADCBK as in FIG. 2, but differs from FIG. 2 in the external configuration. In FIG. 2, the pull-up resistors Rb[0] to Rb[4] are connected between each input port of ADCBK and VCCA. In FIG. 27, pull-down resistors Rb[0] to Rb[4] are connected between each input port and VSSA. The case in FIG. 2 is referred to as a "pull-up type" and the one in FIG. 27 is referred to as a "pull-down type".

The pull-up type and the pull-down type can be properly selected according to the range of the voltage signal applied to each of the signal input terminals Vint[0] to Vint[4] of each of the channels [0] to [4], and can be independently set for each channel. With the input range of the analog/digital conversion circuit ADC being from VSSA to VCCA, if the range of a certain channel is within the range from VSSA to VCCA and deviated to the VCCA, the pull-down type is preferable. In contrast, if the range of a certain channel is within the range from VSSA to VCCA and deviated to the VSSA, the pull-up type is preferable. Whether to use the pull-up type or to use the pull-down type is notified to the analog/digital conversion circuit block ADCBK in advance as a setting signal, and accordingly, ADCBK executes a different sequence during disconnection detection.

Figure 28:
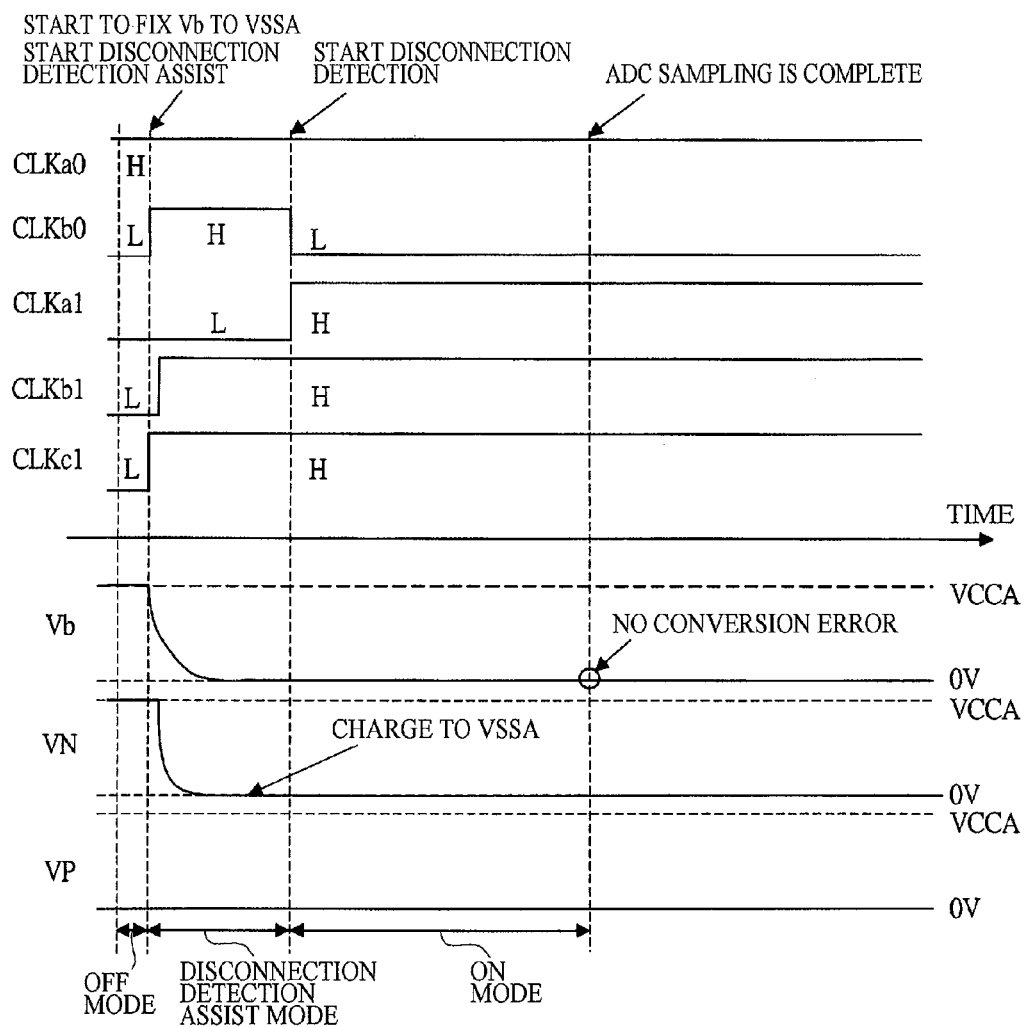
FIG. 28 is a waveform chart showing an operation during disconnection detection in the analog/digital conversion circuit block in FIG. 27.

FIG. 28 is a waveform chart showing an operation during disconnection detection in the analog/digital conversion circuit block of FIG. 27. In FIG. 28, the operation of the pull-up type in FIG. 5 is changed to the pull-down type on the premise of the above-mentioned configuration in FIG. 3. In FIG. 28, during disconnection detection, the T-type switch circuit TS[k] is caused to transition from the off mode to the on mode via the disconnection detection assist mode. When TS[k] is in the off mode, MPu and MNd in the pull-up/pull-down circuit PUPD are also off and the voltage Vb of the input terminal Ain of ADC becomes unstable. However, usually, in the preceding phase, to reset the value of Ain associated with the previous measurement, Vb is driven to the VCCA level via MPu. Moreover, when TS[k] is in the off mode, the voltage VN is controlled to VCCA and the voltage VP is controlled to VSSA, as described above.

Next, TS[k] transitions to the disconnection detection assist mode. In the disconnection detection assist mode, CLKb0 in PUPD is driven to an 'H' level, and Vb is pulled down to VSSA via MNd. Moreover, because MN2 is already turned on in TS[k], VN is also discharged to VSSA via MN2 and MNd. As a result, the Vb, VN, and VP are all set to VSSA. Next, TS[k] transitions to the on mode. In the on mode, MPu and MNd in PUPD are turned off and the input port A[k] is connected to Ain via TS[k]. The voltage Va of A[0] where there is a disconnection is set to VSSA via Rb[0] and additionally, associated with the disconnection detection assist mode, VN is also already set to VSSA, not to VCCA, and thus a charging current via Rb[0] does not flow. As a result, the voltage drop via Rb[0] is not caused and a conversion error of ADC is not generated.

By A/D conversion of Vb by ADC, a digital code of VSSA is output. This result indicates the presence of a disconnection. If no disconnection is in the channel[k], Vb is Vint[k] because typically Ra[k] (0 to 1 KΩ) is smaller than Rb[k] (1 MΩ). By A/D conversion of this value, a digital code of Vint[k] is output and the absence of a disconnection is determined. The digital code of VSSA in the case where a disconnection is in FIG. 27 and the digital code of VCCA in the case where a disconnection is in FIG. 5 described above need to have a certain degree of width. Then, if the resultant digital code is within the range of a channel to be measured within the range from VSSA to VCCA, it is determined as the absence of a disconnection. If it is outside the range of the channel to be measured, the presence of a disconnection is determined.

As described above, by using the semiconductor integrated circuit device in accordance with Embodiment 8, the same effect as Embodiment 1 can be obtained. The configuration and operation of the pull-down type have been described by taking Embodiment 1, but Embodiments 2 to 7 can also be modified to the pull-down type in a similar manner.

The invention made by the present inventor has been described specifically according to the embodiments, but the invention is not limited to these embodiments. Various modifications can be made without departing from the gist.

The semiconductor integrated circuit devices in accordance with the embodiments can be widely applied to semiconductor products in general provided with an analog/digital conversion circuit block requiring disconnection detection.

What is claimed is:

1. A semiconductor integrated circuit device comprising
an input port connected to a first power supply voltage via a first resistor and connected to, an analog signal input terminal to be measured via a second resistor having a resistance lower than the first resistor;
a first MIS transistor of a first conductivity type, wherein a first end of a source/drain is connected to the input port;
a second MIS transistor of a second conductivity type, wherein the first end of a source/drain is connected to the input port;
a first wiring path which connects a second end of the source/drain of the first MIS transistor and the second end of the source/drain of the second MIS transistor to a first node;
an analog/digital conversion circuit converting a voltage of the first node into a digital signal; and
a first cycle and a second cycle to be executed in detecting a presence or absence of a disconnection in a path from the analog signal input terminal to the input port,
wherein in the first cycle, the first and second MIS transistors are turned off and the first wiring path is pre-charged to the first power supply voltage, and
wherein in the second cycle to be executed subsequent to the first cycle, the first and second MIS transistors are turned on and an operation by the analog/digital conversion circuit is performed.

2. The semiconductor integrated circuit device in accordance with claim 1, further comprising
a T-type switch circuit provided between the input port and the first node, the T-type switch circuit including third and fourth MIS transistors of the first conductivity type and fifth and sixth MIS transistors of the second conductivity type, in addition to the first and second MIS transistors; and
a pre-charge circuit connecting the first node to the first power supply voltage in response to a first control signal,
wherein a source/drain path of the third MIS transistor is connected between the second end of the source/drain of the first MIS transistor and the first node,
wherein a source/drain path of the fourth MIS transistor is connected between the second power supply voltage and the second end of the source/drain of the second MIS transistor,
wherein a source/drain path of the fifth MIS transistor is connected between the second end of the source/drain of the second MIS transistor and the first node,
wherein a source/drain path of the sixth MIS transistor is connected between a third power supply voltage higher than the second power supply voltage and the second end of the source/drain of the first MIS transistor,
wherein either one of the second power supply voltage or the third power supply voltage is the first power supply voltage,
wherein in the first cycle, the first node is connected to the first power supply voltage by the pre-charge circuit, the first and second MIS transistors are turned off, the third and fifth MIS transistors are turned on, and at least one of the fourth and sixth MIS transistors, the one being arranged on a side different from the first power supply voltage, is turned off, and
wherein in the second cycle, a connection between the first node and the first power supply voltage made by the pre-charge circuit is cut, the first, second, third, and fifth MIS transistors are turned on, and the fourth and sixth MIS transistors are turned off.

3. The semiconductor integrated circuit device in accordance with claim 2, further comprising a third cycle executed in a previous phase to detect the presence or absence of a disconnection,
wherein in the third cycle, the first, second, third, and fifth MIS transistors are turned off and the fourth and sixth MIS transistors are turned on, and
wherein in transition from the third cycle to the first cycle, at least one of the fourth and sixth MIS transistors, the one being arranged on a side different from the first power supply voltage, is turned off and then the third and fifth transistors are turned on.

4. The semiconductor integrated circuit device in accordance with claim 1, further comprising a T-type switch circuit with an equalizer provided between the input port and the first node, the T-type switch circuit including third, fourth, and seventh MIS transistors of the first conductivity type and fifth, sixth, and eighth MIS transistors of the second conductivity type, in addition to the first and second MIS transistors,
wherein a source/drain path of the third MIS transistor is connected between the second end of the source/drain of the first MIS transistor and the first node,
wherein a source/drain path of the fourth MIS transistor is connected between the second power supply voltage and the second end of the source/drain of the second MIS transistor,
wherein a source/drain path of the fifth MIS transistor is connected between the second end of the source/drain of the second MIS transistor and the first node,
wherein a source/drain path of the sixth MIS transistor is connected between a third power supply voltage higher than the second power supply voltage and the second end of the source/drain of the first MIS transistor,
wherein source/drain paths of the seventh and eighth MIS transistors are connected in parallel between the second end of the source/drain of the first MIS transistor and the second end of the source/drain of the second MIS transistor,
wherein either one of the second power supply voltage or the third power supply voltage is the first power supply voltage,
wherein in the first cycle, one of the fourth and sixth MIS transistors, the one being arranged on the first power supply voltage is turned on and other one is turned off, and the third, fifth, seventh, and eighth MIS transistors are turned on, and the first and second MIS transistors are turned off, and
wherein in the second cycle, the first, second, third, fifth, seventh, and eighth MIS transistors are turned on and the fourth and sixth MIS transistors are turned off.

5. The semiconductor integrated circuit device in accordance with claim 4, further comprising a third cycle executed in a previous phase to detect the presence or absence of a disconnection,
wherein in the third cycle, the first, second, third, fifth, seventh, and eighth MIS transistors are turned off and the fourth and sixth MIS transistors are turned on, and
wherein in transition from the third cycle to the first cycle, the third, fifth, seventh, and eighth transistors are turned on after the other one of the fourth and sixth MIS transistors is turned off.

6. The semiconductor integrated circuit device according to claim 4, wherein the T-type switch circuit with an equalizer further comprises
a ninth MIS transistor of the first conductivity type, wherein a source/drain path is connected between the second end of the source/drain of the first MIS transistor and the first node; and
a booster circuit which controls the gate of the first MIS transistor and the gate of the ninth MIS transistor with a fourth power supply voltage higher than the third power supply voltage.

7. A semiconductor integrated circuit device, comprising:
a first input port connected to a first power supply voltage or a second power supply voltage via a first resistor and connected to a first analog signal input terminal to be measured via a second resistor having a resistance lower than the first resistor;
a second input port connected to the first power supply voltage or the second power supply voltage via a third resistor and connected to a second analog signal input terminal to be measured via a fourth resistor having a resistance lower than the third resistor;
a third input port connected to the first power supply voltage via a fifth resistor and connected to a third analog signal input terminal to be measured via a sixth resistor having a resistance lower than the fifth resistor;
a first switch circuit, both ends of which are connected to the first input port and a first node;
a second switch circuit, both ends of which are connected to the first input port and a second node;
a third switch circuit, both ends of which are connected to the second input port and the second node;
a fourth switch circuit, both ends of which are connected to the third input port and the second node;
an analog/digital conversion circuit converting a voltage of the first node into a digital signal; and
a first cycle and a second cycle executed in detecting a presence of absence of a disconnection in a path from the third analog signal input terminal to the third input port;
wherein each of the second and fourth switch circuits includes a first MIS transistor of a first conductivity type and a second MIS transistor of a second conductivity type,
wherein a first end of a source/drain of each of the first and second MIS transistors in the fourth switch circuit is commonly connected to the third input port,
wherein in the first cycle, the first and second MIS transistors in the fourth switch circuit are turned off, and a first wiring path extending from a second end of the source/drain of each of the first and second MIS transistors in the fourth switch circuit to the first node via the second node and the second switch circuit is pre-charged to the first power supply voltage, and
wherein in the second cycle to be executed subsequent to the first cycle, the second and fourth switch circuits are turned on, and an operation by the analog/digital conversion circuit is performed.

8. The semiconductor integrated circuit device in accordance with claim 7, further comprising a first pre-charge circuit connecting the first node to the first power supply voltage in response to the first control signal,
wherein each of the second and fourth switch circuits is a CMOS switch circuit including the first and second MIS transistors,
wherein in the first cycle, the first node is connected to the first power supply voltage by the first pre-charge circuit, the second switch circuit is turned on, and the fourth switch circuit is turned off, and
wherein in the second cycle, a connection between the first node and the first power supply voltage made by the first pre-charge circuit is cut, and the second and fourth switch circuits are turned on.

9. The semiconductor integrated circuit device in accordance with claim 7, further comprising:
a first pre-charge circuit connecting the first node to the first power supply voltage in response to the first control signal, and
a second pre-charge circuit connecting the second node to the first power supply voltage in response to the second control signal,
wherein each of the second and fourth switch circuits is a CMOS switch circuit including the first and second MIS transistors,
wherein in the first cycle, the first and second nodes are connected to the first power supply voltage by the first and second pre-charge circuits, the second switch circuit is turned on or off, and the fourth switch circuit is turned off, and
wherein in the second cycle, a connection between the first and second nodes and the first power supply voltage made by the first and second pre-charge circuits is cut, and the second and fourth switch circuits are turned on.

10. The semiconductor integrated circuit device in accordance with claim 7,
wherein each of the second and fourth switch circuits is a T-type switch circuit including third and fourth MIS transistors of the first conductivity type and fifth and sixth MIS transistors of the second conductivity type, in addition to the first and second MIS transistors,
wherein in the second switch circuit, a first end of a source/drain of each of the first and second MIS transistors is commonly connected to the second node, a source/drain path of the third MIS transistor is connected between a second end of the source/drain of the first MIS transistor and the first node, a source/drain path of the fourth MIS transistor is connected between the third power supply voltage and the second end of the source/drain of the second MIS transistor, a source/drain path of the fifth MIS transistor is connected between the second end of the source/drain of the second MIS transistor and the first node, and a source/drain path of the sixth MIS transistor is connected between a fourth power supply voltage higher than the third power supply voltage and the second end of the source/drain of the first MIS transistor,
wherein in the fourth switch circuit, a source/drain path of the third MIS transistor is connected between the second end of the source/drain of the first MIS transistor and the second node, a source/drain path of the fourth MIS transistor is connected between the third power supply voltage and the second end of the source/drain of the second MIS transistor, a source/drain path of the fifth MIS transistor is connected between the second end of the source/drain of the second MIS transistor and the second node, a source/drain path of the sixth MIS transistor is connected between the fourth power supply voltage and the second end of the source/drain of the first MIS transistor, and either one of the third power supply voltage or the fourth power supply voltage is the first power supply voltage, wherein each of the second and fourth switch circuits includes:

an off mode in which the first, second, third, and fifth MIS transistors are turned off and the fourth and sixth MIS transistors are turned on;

a first assist mode in which the first and second MIS transistors are turned off, the third and fifth MIS transistors are turned on, and at least one of the fourth and sixth MIS transistors, the one being arranged on a side different from the first power supply voltage, is turned off; and an on mode in which the first, second, third, and fifth MIS transistors are turned on and the fourth and sixth MIS transistors are turned off.

11. The semiconductor integrated circuit device in accordance with claim 10, further comprising a first pre-charge circuit connecting the first node to the first power supply voltage in response to the first control signal, wherein in the first cycle, the first node is connected to the first power supply voltage by the first pre-charge circuit, the second switch circuit is controlled to the on mode, and the fourth switch circuit is controlled to the first assist mode, and wherein in the second cycle, a connection between the first node and the first power supply voltage made by the first pre-charge circuit is cut, and the second and fourth switch circuits are controlled to the on mode.

12. The semiconductor integrated circuit device in accordance with claim 10, further comprising:

a first pre-charge circuit connecting the first node to the first power supply voltage in response to the first control signal; and a second pre-charge circuit connecting the second node to the first power supply voltage in response to the second control signal, wherein in the first cycle, the first and second nodes are connected to the first power supply voltage by the first and second pre-charge circuits, the second switch circuit is controlled to the on mode or the first assist mode, and the fourth switch circuit is controlled to the first assist mode, and wherein in the second cycle, a connection between the first and second nodes and the first power supply voltage made by the first and second pre-charge circuits is cut, and the second and fourth switch circuits are controlled to the on mode.

13. The semiconductor integrated circuit device in accordance with claim 7, wherein each of the second and fourth switch circuits is a T-type switch circuit with an equalizer, the T-type switch including third, fourth, and seventh MIS transistors of the first conductivity type and fifth, sixth, and eighth MIS transistors of the second conductivity type, in addition to the first and second MIS transistors, wherein in the second switch circuit, a first end of a source/drain of each of the first and second MIS transistors is commonly connected to the second node, a source/drain path of the third MIS transistor is connected between the second end of the source/drain of the first MIS transistor and the first node, a source/drain path of the fourth MIS transistor is connected between the third power supply voltage and the second end of the source/drain of the second MIS transistor, a source/drain path of the fifth MIS transistor is connected between the second end of the source/drain of the second MIS transistor and the first node, a source/drain path of the sixth MIS transistor is connected between a fourth power supply voltage higher than the third power supply voltage and the second end of the source/drain of the first MIS transistor, a source/drain path of each of the seventh and eighth MIS transistors is connected in parallel between the second end of the source/drain of the first MIS transistor and the second end of the source/drain of the second MIS transistor, and wherein in the fourth switch circuit, a source/drain path of the third MIS transistor is connected between the second end of the source/drain of the first MIS transistor and the second node, a source/drain path of the fourth MIS transistor is connected between the third power supply voltage and the second end of the source/drain of the second MIS transistor, a source/drain path of the fifth MIS transistor is connected between the second end of the source/drain of the second MIS transistor and the second node, a source/drain path of the sixth MIS transistor is connected between the fourth power supply voltage and the second end of the source/drain of the first MIS transistor, and a source/drain path of each of the seventh and eighth MIS transistors is connected in parallel between the second end of the source/drain of the first MIS transistor and the second end of the source/drain of the second MIS transistor, and either one of the third power supply voltage or the fourth power supply voltage is the first power supply voltage.

14. The semiconductor integrated circuit device in accordance with claim 13, wherein each of the second and fourth switch circuits includes an off mode in which the first, second, third, fifth, seventh, and eighth MIS transistors are turned off and the fourth and sixth MIS transistors are turned on;

a second assist mode in which one of the fourth and sixth MIS transistors, the one being arranged on the first power supply voltage, is turned on and other one is turned off, and the first and second MIS transistors are turned off, and the third, fifth, seventh, and eighth MIS transistors are turned on; and an on mode in which the first, second, third, fifth, seventh, and eighth MIS transistors are turned on and the fourth and sixth MIS transistors are turned off, wherein in the first cycle, the second and fourth switch circuits are controlled to the second assist mode, and wherein in the second cycle, the second and fourth switch circuits are controlled to the on mode.

15. The semiconductor integrated circuit device in accordance with claim 13, wherein each of the second and fourth switch circuits includes an off mode in which the first, second, third, fifth, seventh, and eighth MIS transistors are turned off and the fourth and sixth MIS transistors are turned on;

a second assist mode in which one of the fourth and sixth MIS transistors, the one being arranged on the first power supply voltage, is turned on and other one is turned off, and the first and second MIS transistors are turned off, and the third, fifth, seventh, and eighth MIS transistors are turned on;

an on mode in which the first, second, third, fifth, seventh, and eighth MIS transistors are turned on and the fourth and sixth MIS transistors are turned off; and a third assist mode in which the first, second, third, fifth, seventh, and eighth MIS transistors are turned on, and one of the fourth and sixth MIS transistors, the one being arranged on the first power supply voltage, is turned on and other one is turned off, wherein in the first cycle, the second switch circuit is controlled to the third assist mode and the fourth switch circuit is controlled to the second assist mode, and wherein in the second cycle, the second and fourth switch circuits are controlled to the on mode.

* * * * *